US010849246B2

(12) United States Patent
Hooten et al.

(10) Patent No.: US 10,849,246 B2
(45) Date of Patent: Nov. 24, 2020

(54) DEVICE ENCLOSURE

(71) Applicant: Apple Inc., Cupertino, CA (US)

(72) Inventors: Lee E. Hooten, Ridge, NY (US); Michael B. Wittenberg, San Francisco, CA (US); Andrew J. Meschke, San Jose, CA (US); Alexander W. Williams, Santa Clara, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/417,590

(22) Filed: May 20, 2019

(65) Prior Publication Data
US 2020/0205307 A1 Jun. 25, 2020

Related U.S. Application Data

(60) Provisional application No. 62/784,066, filed on Dec. 21, 2018.

(51) Int. Cl.
| H05K 5/04 | (2006.01) |
| H05K 5/03 | (2006.01) |
| H05K 5/00 | (2006.01) |
| G06F 1/16 | (2006.01) |
| H05K 5/02 | (2006.01) |

(52) U.S. Cl.
CPC ............ *H05K 5/04* (2013.01); *H05K 5/0017* (2013.01); *H05K 5/03* (2013.01); *G06F 1/1626* (2013.01); *G06F 1/1637* (2013.01); *H05K 5/02* (2013.01)

(58) Field of Classification Search
CPC ... G06F 1/1637; G06F 1/1626; H05K 5/0017; H05K 5/02; H05K 5/03; H05K 5/04
See application file for complete search history.

(56) References Cited

U.S. PATENT DOCUMENTS

2012/0076573 A1 3/2012 Pilliod et al.
2013/0286627 A1 10/2013 Lee et al.
(Continued)

FOREIGN PATENT DOCUMENTS

DE 3732206 A1 4/1989
GB 1373962 A 11/1974

OTHER PUBLICATIONS

PCT International Search Report and Written Opinion for International Application No. PCT/US2019/061734, dated May 15, 2020 (34 pp.).

*Primary Examiner* — Carson Gross
(74) *Attorney, Agent, or Firm* — Dorsey & Whitney LLP

(57) ABSTRACT

An element for an electronic device can include a metal exterior portion including a first material, an interior portion including a second, independently selected material, and an engagement feature formed on a surface defined by the exterior and interior portions. The engagement feature can mechanically engage a material molded to the surface. A method for forming an element for an electronic device can include joining a boss to a member, forming a feature in the member while orienting the member via the boss, and at least partially removing the boss to form the element. An electronic device can include a frame defining an interior volume of the device, a display component, a transparent cover positioned adjacent to the display component, and an encapsulating material at least partially surrounding the display component and joining the display component to the frame.

9 Claims, 18 Drawing Sheets

(56) References Cited

U.S. PATENT DOCUMENTS

| | | |
|---|---|---|
| 2016/0174398 A1* | 6/2016 | Ido .................. G06F 1/1626 |
| | | 361/807 |
| 2016/0207236 A1 | 7/2016 | Tsubota et al. |
| 2016/0320658 A1 | 11/2016 | Reightler et al. |
| 2017/0069956 A1 | 3/2017 | Hill et al. |
| 2017/0196110 A1 | 7/2017 | Shinn |
| 2018/0017995 A1 | 1/2018 | Gable et al. |
| 2018/0103557 A1 | 4/2018 | Wright et al. |

* cited by examiner

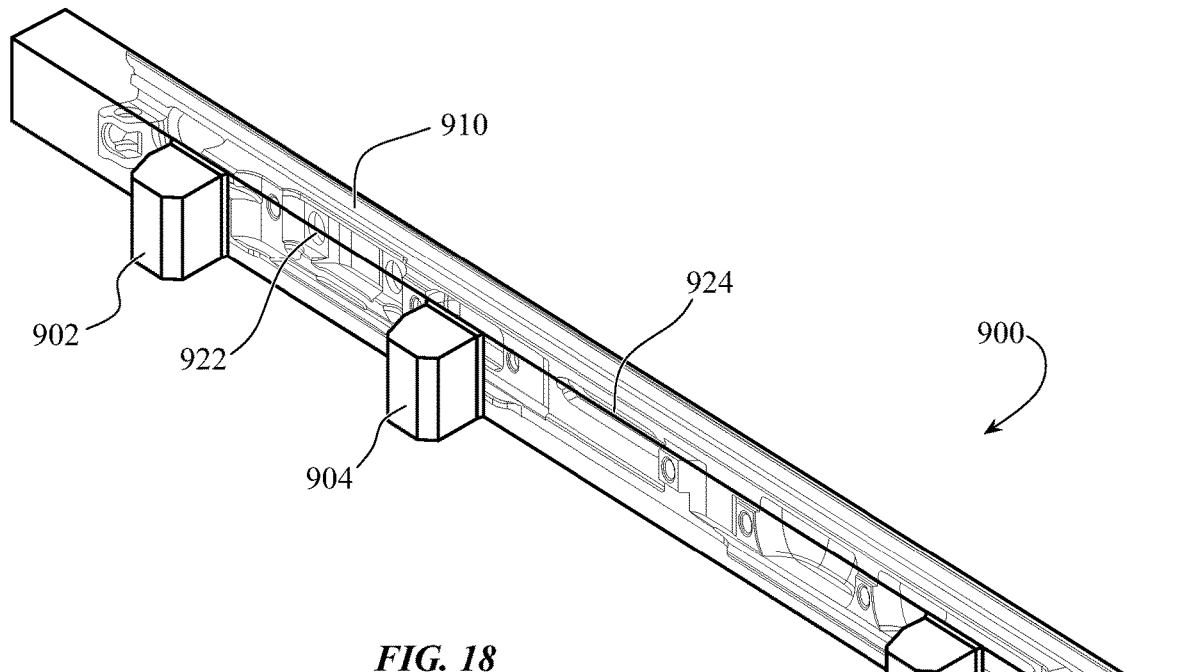
FIG. 18
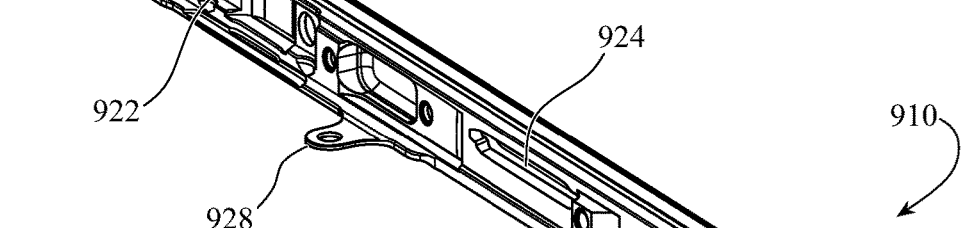
FIG. 19

DEVICE ENCLOSURE

CROSS-REFERENCE TO RELATED APPLICATION(S)

This application claims priority to U.S. Provisional Patent Application No. 62/784,066, filed Dec. 21, 2018, and entitled "DEVICE ENCLOSURE," the entire disclosure of which is hereby incorporated by reference.

FIELD

The described embodiments relate generally to electronic devices. More particularly, the present embodiments relate to enclosures for electronic devices.

BACKGROUND

Electronic devices are widespread in society and can take a variety of forms, from wristwatches to computers. Electronic devices, including portable electronic devices such as handheld phones, tablet computers, and watches, can experience contact with various surfaces during use. Further, use, transportation, and storage of such devices can exert mechanical and thermal stresses thereon.

Components for these devices, such as enclosures or housings, can benefit from exhibiting different combinations of properties relating to the use of the device. A housing for a portable electronic device can have a combination of properties, such as strength, appearance, toughness, abrasion resistance, weight, corrosion resistance, thermal conductivity, electromagnetic shielding, and cost, in order for the device to function as desired. Certain materials can provide a desired level of performance with respect to some properties, but may not provide an optimal level of performance with respect to other others. Thus, it can be desirable to provide a device enclosure including multiple materials to achieve a desired combination of somewhat disparate properties.

Further, the combination of multiple materials in complex design configurations can introduce complications into traditional manufacturing processes. For example, device enclosures formed of multiple materials can require increased processing time, material, and cost when manufactured using traditional techniques. In some examples, common manufacturing processes may not be able to produce a device enclosure with a desired combination of properties. Accordingly, it can be desirable to provide processing and manufacturing techniques that can allow for efficient, low cost, and low waste production of device enclosures having a desired combination of differing properties.

SUMMARY

According to some aspects of the present disclosure, a method of forming a frame element for an electronic device can include joining a boss to an elongate frame member, forming a feature in the frame member by a manufacturing process, wherein the frame member is oriented in one or more desired positions during the manufacturing process via the boss, and removing the boss from the frame member to form the frame element.

In some examples, the manufacturing process can be a subtractive manufacturing process and the boss can be configured to engage a positioning apparatus and to mechanically support the frame member as the positioning apparatus orients the frame member in the one or more desired positions to allow for removal of material from a desired portion of the frame member during the subtractive manufacturing process. Removing the boss can include removing material from the boss to form a feature on the frame member. The manufacturing process can include a machining process. Joining can include welding, brazing, diffusion bonding, or adhering, for example, by gluing.

According to some aspects, a housing of an electronic device can include a pre-formed outer portion including a first material having a first set of material properties, the outer portion at least partially defining a feature and an exterior surface of the electronic device, an inner portion including a second material having a second set of material properties independent of the first set of material properties, the inner portion at least partially defining the feature and an inner volume of the electronic device, the inner portion being joined to the pre-formed outer portion to form a composite body, and an engagement feature configured to mechanically engage a moldable material, the engagement feature positioned at a surface of the housing defined by the inner portion and the pre-formed outer portion.

In some examples, the engagement feature can include at least one of a nano-structured or micro-structured feature. The engagement feature can be formed by an etching or machining process. The engagement feature can be formed by an additive manufacturing process.

According to some aspects, a method of forming a component for an electronic device can include joining a metal portion including a first material having a first material property to a second portion including a second material having a second material property independent of the first material property, forming one or more features in the second portion, and treating a surface defined by the metal portion and the second portion to form an engagement feature.

In some examples, the method can further include molding a material to the surface to mechanically engage the engagement feature. Joining can include welding, brazing, diffusion bonding, die casting the second material into the metal portion, or adhering. Treating the surface can include etching the surface or depositing material onto the surface.

According to some aspects, an electronic device can include a frame element including a surface that at least partially defines an exterior surface of the electronic device, a display component, a transparent cover disposed adjacent to the display component, and an encapsulating material in contact with and at least partially surrounding a periphery of the display component, the encapsulating material bonded to the frame element and positioned interior to the surface.

In some examples, an edge of the transparent cover and an edge of the moldable material can be aligned in a plane. The plane can be substantially parallel to and spaced apart from a wall of the frame element. The encapsulating material can be bonded to the frame element with an adhesive.

According to some aspects, a method of forming an electronic device can include at least partially surrounding a periphery of a display component with a moldable material, positioning a transparent cover adjacent to a surface of the display component, and joining the display component and transparent cover to a frame element at least partially defining an exterior surface of the electronic device by the moldable material.

In some examples, joining can include bonding the frame element to the moldable material with an adhesive. An edge of the transparent cover and an edge of the moldable material can be substantially aligned in a plane and the plane is substantially parallel to and spaced apart from a wall of the frame element.

BRIEF DESCRIPTION OF THE DRAWINGS

The disclosure will be readily understood by the following detailed description in conjunction with the accompanying drawings, wherein like reference numerals designate like structural elements, and in which:

FIG. 18 shows a stage of a process for forming a component for an electronic device.

FIG. 19 shows a stage of a process for forming a component for an electronic device.

DETAILED DESCRIPTION

Figure 1:
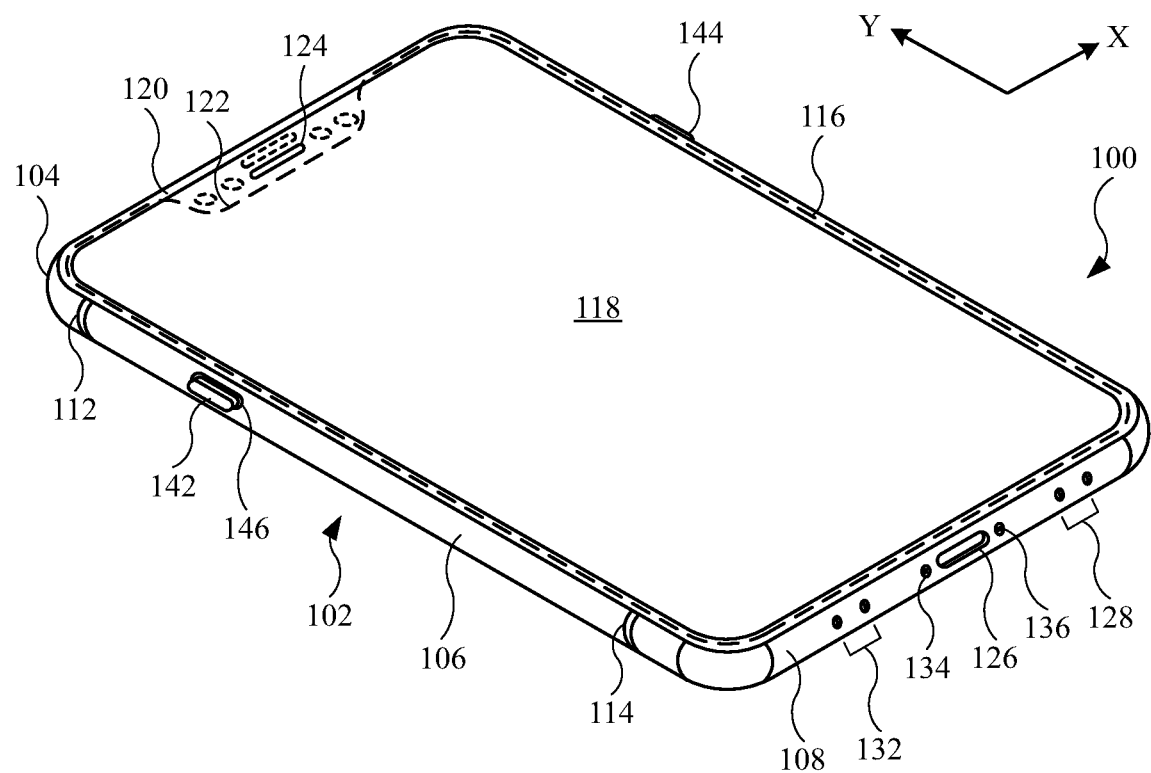
FIG. 1 shows a perspective view of an electronic device.

The present description provides examples, and is not limiting of the scope, applicability, or configuration set forth in the claims. Thus, it will be understood that changes can be made in the function and arrangement of elements discussed without departing from the spirit and scope of the disclosure, and various embodiments can omit, substitute, or add other procedures or components as appropriate. For instance, methods described can be performed in an order different from that described, and various steps can be added, omitted, or combined. Also, features described with respect to some embodiments can be combined in other embodiments.

One aspect of the present disclosure relates to composite housings or enclosures for electronic devices, and methods of forming the same. A composite housing, or component of a housing, can include a pre-formed exterior or outer portion, also referred to as a shell, having a first set of material properties; and an interior or inner portion, also referred to as a core, having a second, different set of material properties that are independent of the first set of material properties. The pre-formed exterior portion can include a metallic material, such as stainless steel. The interior portion can include a metallic material such as aluminum. The pre-formed exterior portion and the interior portion can be welded, bonded, adhered, or otherwise joined together such that they form the housing, or a portion thereof, and act as a composite body. In some cases, the composite body can be treated as unitary body with respect to machining, manufacturing, assembly, or other processes. The pre-formed outer portion and the inner portion can together define an engagement feature that can mechanically engage with a moldable material positioned at a surface of the composite component, including the outer portion and the inner portion. The moldable material can mechanically engage the engagement feature and join or bond the composite housing to one or more components mounts, or enclosures.

Another aspect of the present disclosure relates to methods of forming components or elements of an electronic device, such as a frame, an enclosure, a housing, and other device elements. In some examples, a method for forming an element of a housing or enclosure can include joining multiple bosses to an elongate member, such as a composite body or a unitary body. The bosses can be joined to a face of the elongate member, for example, by welding or an adhesive, and can be mechanically engaged by an apparatus to position and orient the elongate member in any number of desired positions during a manufacturing or forming process. Features can then be formed in the elongate member by a process, such as machining, with the apparatus positioning the elongate member in a desired position, via the bosses, to facilitate the machining process. For example, the elongate member can be rotated to facilitate the machining of features such that the elongate member is at a reduced risk of damage from the machining process. In some examples, the bosses can then be removed from the elongate member, for example by machining or cutting, to form the element. In other examples, however, the bosses can remain on the elongate member and form one or more features of the elongate member.

Another aspect of the present disclosure includes an electronic device having an encapsulating material at least partially surrounding a display component, and methods of forming the same. In some examples, an electronic device can include a frame, an enclosure, or a housing, for example, as described herein. The electronic device can include a display component and a transparent cover disposed adjacent to a major surface of the display component; the transparent cover at least partially defining an exterior surface of the electronic device. An encapsulating material, such as a moldable polymer material, can contact and at least partially surround a periphery of the display component. Further, the encapsulating material can be positioned in an interior volume of the electronic device and can be directly bonded to the frame to retain the display component in the electronic device with fewer or with no additional mounting components.

Other exemplary methods and apparatuses described herein include methods for forming an engagement feature on the surface of a composite component including a first material and a second material. The engagement feature can allow for the assembly of device enclosures that have desired mechanical or chemical properties, while still providing for the transmission of electromagnetic waves, for example as used in inductive charging or wireless communication, through the enclosure. Such methods can provide device enclosures including composite components that allow for the decoupling of the material properties of the interior, primarily structural or functional portion of the housing from the exterior, primarily cosmetic portion of the housing. In some examples, a composite component can include an inner portion joined or bonded to a pre-formed outer portion, where the materials of each portion are independently selected. That is, the material of the inner portion can be selected in order to optimize one or more properties of the composite housing while the material of the exterior portion can be independently selected to optimize one or more other desired properties of the housing. For example, the material and/or geometry of the inner portion can be selected in order achieve a desired level of strength, weight, stiffness, cost, thermal conductivity, electromagnetic transparency, machinability, carbon footprint, recyclability, other properties, or combinations thereof. Meanwhile, the material and/or geometry of the exterior portion can be independently selected in order to achieve any of the above properties or a desired level of hardness, corrosion resistance, scratch resistance, cosmetic finish, other properties, or combinations thereof.

Frames or enclosures including components formed from electrically conductive materials can also include portions formed from insulating materials, such as polymers, to allow for the transmission of electromagnetic waves through the enclosure. In some examples, an insulating material can be used to join or bond two components, such as conductive components, to form the enclosure. Traditional methods of forming device enclosures from frame components can include the formation of engagement features on a surface of the component that can be mechanically engaged by an insulating material. Such features can be formed by, for example, etching processes.

Traditional formation processes, such as traditional etching processes, are not well suited for the formation of composite components, such as one with a steel exterior and an aluminum interior. In some examples, as described herein, methods are described for forming engagement features on a surface of a composite component defined by the interior portion and the exterior portion. In some examples, such features can be formed by, for example, etching the interior portion with a process that does not etch the exterior portion, and etching the exterior portion with a process that does not etch the interior portion, thereby forming an engagement feature. The formation of such features allows for an enclosure to be formed by bonding or joining two or more composite components with an insulating material, via the engagement feature, as described herein.

The methods, components, and devices described herein provide for the manufacture of electronic devices including enclosures or housings that have reduced costs, desired mechanical, chemical, or physical properties, and/or desired geometries. For example, methods for forming components such as frame elements for electronic devices can allow for faster production of components with reduced material waste, as compared to traditional methods of manufacturing. Further, in some examples, methods for forming components including joining one or more bosses to a machinable member can allow for the formation of unique or desired component geometries that can be too expensive or time-consuming to form by other techniques. By utilizing bosses joined to a member to manipulate the member during feature formation, these methods can allow for the precise orientation of the member in any number of desired positions to facilitate feature formation. Whereas traditional methods of forming features, such as by machining a stationary member, can produce substantially more material waste and can involve longer machining times or increased wear on the machining apparatus.

It is also desirable for a display of an electronic device to occupy or define as much of the exterior surface of an electronic device as possible, to provide a user with a large area to display visual content while keeping the overall size of the device relatively small. Accordingly, in some examples, such as when an electronic device includes a peripheral frame or enclosure, it can be desirable to position the display close to an edge of the frame or enclosure. Traditional methods of securing displays and display components to device frames and enclosures, however, typically include additional support components that are joined to both the frame and the display component. These support components can add increased cost and assembly time during device manufacturing, and can also increase the distance between the display component and the edge of the frame, resulting in a reduced display area. In some examples, as described herein, an electronic device can include a display component and an encapsulating material in contact with and at least partially surrounding a periphery of the display component. In some examples, the encapsulating material can be bonded directly to the frame, enclosure, or housing of an electronic device and positioned within an interior volume of the device. In other examples, the encapsulating material can be a polymer material, such as an epoxy or resin. While traditional mounting or support components for displays are metal, by making the encapsulating material a polymer, it can provide for increased shock absorption and impact resistance relative to a metal support components, thereby protecting the display from mechanical stresses that can be experienced by the device. For example, during a drop event, the encapsulating material can reduce the amount of mechanical stress experience by the display component relative to a similar device including a traditional mounting component.

According to some aspects of the present disclosure, a housing, frame, or enclosure of an electronic device can include a composite component. As described herein, a composite component can include a pre-formed exterior or outer portion, also referred to as a shell, having a first set of material properties. The pre-formed exterior portion can include a metallic material, polymeric material, ceramic material, or combinations thereof. The composite housing can also include an interior or inner portion, also referred to as a core, having a second, different set of material properties that are independent of the first set of material properties. For example, the interior portion can include a metallic material, polymeric material, ceramic material, or combinations thereof. The pre-formed exterior portion and the interior portion can be welded, bonded, adhered, or otherwise joined together such that they form the housing or a portion thereof and act as a composite body.

In some examples, the composite component can include one or more engagement features formed in or on a surface defined by both the interior portion and the exterior portion. In some examples, these engagement features can range in size from nano- or micro-scaled features to macro-scale features having dimensions on the order or millimeters. In some examples, an engagement feature can include a shape such that moldable material can flow or be provided into or around the engagement feature. In some examples, the engagement feature can be such that upon cooling, curing, hardening, or otherwise solidifying, the moldable material mechanically engages the feature to retain the moldable material on the composite component.

In some examples, two or more composite components including engagement features as described herein can be joined by a moldable material that engages the engagement features of both composite components. In some examples, for example, multiple composite components can thus be joined to form a housing, enclosure, or frame of an electronic device as described herein. The moldable material can include any desired material and can, in some examples, include an electrically insulating material or an electromagnetically transparent material. In some examples, the moldable material can serve to electrically isolate a composite component from a second composite component. In some examples, the moldable material can be a polymer material, such as epoxy, resin, and other similar polymer materials.

In some examples, an engagement feature can be formed on or in a surface of a composite component defined by an interior portion and an exterior portion by any number of additive or subtractive processes. In some examples, an engagement feature formation process can form an engagement feature on a part of the surface defined by the interior portion, but may not form an engagement feature on the part of the surface defined by the exterior portion. In some examples, the engagement feature formation process can additionally form an engagement feature on a part of the surface defined by the exterior portion, but may not form an engagement feature on the part of the surface defined by the interior portion. That is, in some examples, a process for forming an engagement feature can form the feature on only one part of the surface defined by one of the interior or exterior portion during one stage and can form an engagement feature on a part of the surface defined by the other portion during a second stage.

In some examples, formation of an engagement feature can be designed to only affect or substantially affect the material of one of the interior or exterior portions. In some examples, the part of the surface defined by one of the interior or exterior portions can be masked or otherwise treated so that a stage of the engagement feature formation process only affects or forms features on the unmasked, or untreated portion. Alternatively, an engagement feature formation process can form an engagement feature or features on a part of the surface defined by both the interior portion and the exterior portion. That is, in some examples, an engagement feature formation process can affect and form features on or in the material of both the interior portion and the exterior portion of a composite component.

Formation of an engagement feature can include a subtractive process such as machining, etching, laser-based processes, cutting, grinding, and other subtractive processes. In some examples, an engagement feature can be formed by an additive process, such as a deposition process, a spraying process, a 3D printing process, and other similar additive processes. Alternatively, multiple processes can be used to form the engagement feature or features.

In some examples, a method of forming a component for an electronic device can include joining one or more bosses to a member. The member can be a composite body including one or more materials that can optionally have been subjected to processing or treatment prior to joining the one or more bosses. For example, the member can be a composite piece including two or more materials, such as polymer materials, ceramic materials, metal materials, or combinations thereof. Alternatively, however, the member can include two or more portions that have been joined or bonded together to form a composite body. For example, the member can be a composite body as described herein, having an exterior portion including a first material and an interior portion including a second, independently selected material. Further, in some examples, one or more features can be formed in the member prior to or at the same time the bosses are joined to the member.

In some examples, a composite member can include a pre-formed exterior or outer portion, also referred to as a shell, having a first set of material properties. The pre-formed exterior portion can include a metallic material, such as stainless steel. The composite member can also include an interior or inner portion, referred to as a core, having a second, different set of material properties that are independent of the first set of material properties. For example, the interior portion can include a metallic material such as aluminum. The pre-formed exterior portion and the interior portion can be welded, bonded, adhered, or otherwise joined together such that they form the member and act as a composite body.

In some examples, the interior or inner portion of the composite member can include any material that has a desired material property or properties and can be welded, bonded, adhered, or otherwise joined to an exterior portion. For example, the interior portion can include organic materials such as polymeric materials, ceramic materials, metallic materials, or combinations thereof. In some examples, the interior portion can include a metallic material such as aluminum, copper, steel, or alloys or combinations thereof. In some examples, the interior portion can include a metallic material having a foamed structure or a bulk metallic glass. In some examples, the interior portion can itself be a composite material, such as a carbon reinforced polymer material, ceramic reinforced polymer material, a metal matrix composite material, a ceramic matrix composite material, or other composite materials. The interior portion can have any desired thickness. For example, the interior portion of the composite member can have a thickness of several millimeters. In other examples, however, the interior portion of the composite member can have a thickness such that it extends substantially entirely across an entire width of the electronic device.

In some examples, the exterior or outer portion of the composite member can include any material that has a desired material property or properties and can be welded, bonded, adhered, or otherwise joined to an interior portion. For example, the exterior portion can include organic materials such as polymeric materials, ceramic materials, metallic materials, or combinations thereof. In some examples, the exterior portion can include a metallic material such as steel, titanium, or alloys or combinations thereof. In other examples, the exterior portion can include precious or semi-precious metals such as silver, gold, platinum, or alloys or combinations thereof. Alternatively, the exterior portion can include ceramic materials, such as alumina or sapphire, zirconia, carbides, nitrides, borides, oxides, or combinations thereof. The exterior portion can further include a metallic material such as a bulk metallic glass. In some examples, the exterior portion can itself be a composite material, such as a carbon reinforced polymer material, ceramic reinforced polymer material, a metal matrix composite material, a ceramic matrix composite material, or other composite materials.

The exterior portion of the composite member can be a pre-formed or standalone article prior to being joined to the inner portion. That is, in some examples, the material of the exterior portion can be a unitary body, such as a blank, bar, strip, or piece of material. In other examples, however, the exterior portion can be formed from multiple bodies that are joined to the interior portion to form the composite member. In some examples, the exterior portion is not a coating and is not grown, deposited, coated, or otherwise formed on the interior portion. The exterior portion of the composite member can have a thickness of greater than about 25 microns, greater than about 50 microns, greater than about 100 microns, 200 microns, 300 microns, 400 microns, 500 microns, or greater. In some examples, the exterior portion can have a thickness of up to about 1 millimeter, up to about 2 millimeters, or up to about 5 millimeters or more. Further, in some examples, the exterior portion can have a thickness that varies along one or more positions of the exterior portion.

The exterior portion and interior portion of the composite member can be joined by any methods now known in the art or that can be developed in the future. In some examples, the exterior portion can be joined directly to the interior portion, such that a surface of the exterior portion directly contacts, abuts, is fused to, is bonded to, or otherwise is directly joined to the interior portion. The exterior portion can be joined to the interior portion by welding, for example ultrasonic welding or laser welding, brazing, diffusion bonding, fusing, adhering, or other similar methods. In some instances, the exterior portion can form a metallurgical bond with the interior portion along at least a portion of the interface between the exterior and interior portions.

In some examples, the exterior and interior are secured together with the use of an adhesive or other material. For example, the exterior and interior portions can be joined or secured together by a glue or adhesive, such as a resin or epoxy, by a heat activated film, by an injection molded plastic, or other similar adhesives. In some examples, the exterior and interior portions can alternatively or additionally be joined together via mechanical engagement between the portions. For example, features of the exterior portion can mechanically engage features of the interior portion to mechanically join the portions together. These engagement features can range in size from nano- or micro-scaled features to macro-scale features having dimensions on the order of millimeters, and various combinations thereof.

In some examples, the interior portion can be formed into or onto the exterior portion such that a mechanical, metallurgical, other type of bond, or combinations thereof, joins the exterior and interior portions. For example, the interior portion can be cast, molded, such as by metal injection molding, or otherwise formed into the pre-formed exterior portion. In this way, the material of the interior portion can flow into features on the surface of the exterior portion such that when the material of the interior portion solidifies, for example by cooling or curing, a mechanical, metallurgical, or other type of bond is formed between the interior and exterior portions.

In some examples, the composite elongate member can include features formed thereon, or therein, prior to joining one or more bosses to the member. For example, the member can be subjected to treatment or processing to define a substantially flat surface that one or more bosses can be joined to. Further, a surface of the member to which a boss or bosses can be joined can be subject to treatment, for example an etching or cleaning process, to facilitate the joining process. The member can have any desired shape or size, although in some examples, the composite member can be an elongate member, having a length that is greater than a width or height of the member. In some examples, the member can have a length of up to about 1 centimeter, about 2 centimeters, about 3 centimeters, about 5 centimeters, about 10 centimeters, about 20 centimeters, about 30 centimeters, or about 50 centimeters or more. In some examples, the member can have a height and/or width from 1 millimeter or less up to 50 centimeters, or even larger.

In some examples, the member can have a substantially uniform cross-section along its length, although in some other examples the cross-section of the member can vary along its length. The member can have a cross-section of any shape, or shapes. In some examples, the member can have a substantially rectangular or square cross section, or a round cross-section. In some embodiments, the member can have a cross-sectional shape that is substantially rectangular, with one or more of the sides of the rectangle having a curved shape The boss or bosses can be joined to the member, either temporarily or permanently, as desired. In some examples, any method or process can be used to join a boss to the member. A boss can be joined to a surface of the member by any method now known in the art, or that can be developed in the future. In some examples, a boss can be joined directly to the member, such that a surface of the boss directly contacts, abuts, is fused to, is bonded to, or is otherwise directly joined to the member. In some examples, the boss can be joined to the member by welding, for example ultrasonic welding or laser welding, brazing, diffusion bonding, fusing, adhering, or other similar joining methods. In some instances, the boss can form a metallurgical bond with the member along at least a portion of the interface between the boss and the member.

In some examples, a boss and the member can be joined together with the use of an adhesive or another joining material. For example, in some examples, the boss and the member can be joined by a glue or adhesive, such as a resin or epoxy, by a heat activated film, by an injection molded plastic, and other similar adhesives. In some examples, the boss and member can alternatively or additionally be joined together via mechanical engagement between the boss and member. For example, features of the boss can mechanically engage features of the member to mechanically join the boss and member together. In some examples, these engagement features can range in size from nano- or micro-scaled features to macro-scale features having dimensions on the order or millimeters.

The boss or bosses can have any size or shape as desired. Further, where two or more bosses are joined to a member, the bosses can have substantially similar shapes, or the bosses can have a variety of shapes. In some examples, a height and/or width of a boss can be substantially similar to a height and/or width of the member. In some examples, a boss can have a substantially rectangular prismatic shape. In other examples, a boss can have a substantially rectangular prismatic shape with one or more edges of the rectangular prism being chamfered. The boss or bosses can be joined to the member at any desired location. In some examples, multiple bosses can be joined to a single surface of the member, although in other examples, bosses can be joined to multiple different surfaces of the member. The position of the boss or bosses in relation to the member can depend on the feature or features being formed in the member, the forming processes being used, and/or the positioning apparatus being used.

Further, the shape and size of the boss or bosses can depend on the feature or features being formed in the member, the forming processes being used, and/or the positioning apparatus being used. In some examples, the boss or bosses themselves can be, or can be formed into, a feature on the member. In such instances, the size, shape, and position of the boss or bosses can be determined by the desired feature to be formed. In some examples, a boss can include one or more features, for example, to engage a positioning apparatus. The shape of the boss itself can also depend on the positioning apparatus being used, and can be shaped to facilitate engagement with the apparatus.

The member can be formed into a frame, an enclosure, or a housing for an electronic device, or a component thereof. For example, as described herein, an enclosure for an electronic device can include multiple components that are joined together to form the enclosure. Accordingly, in some examples, the member can be formed into a component of such an enclosure. Thus, the formed component or element can be a frame component or element, a housing component or element, or an enclosure component or element. In some examples, however, the member can be formed into any component for an electronic device, including structural components, internal components, buttons, input components, and other similar components.

Once the boss or bosses have been joined to the member, they can be engaged by a positioning apparatus, to thereby support, position, and/or orient the member. In some examples, the positioning apparatus can mechanically support the member via the engaged boss or bosses. In other examples, a positioning apparatus can mechanically engage a boss, thereby supporting and positioning the member. In some examples, a positioning apparatus can engage a boss in alternative or additional ways, for example, by magnetically engaging with the boss, by adhering to the boss with an adhesive or glue, by electrostatic adhesion, or by any other method now known in the art or developed in the future. For example, the member can be rotated and/or translated about any combination of an x-axis, y-axis, and/or z-axis to achieve a desired orientation during the formation process, independently, simultaneously, or substantially simultaneously.

The positioning apparatus can mechanically engage the boss or bosses, for example, by grabbing, clamping, or engaging with one or more engagement features of a boss. In some examples, the positioning apparatus can additionally or alternatively engage a boss by other forms, for example, magnetic engagement, gluing, adhesives, welding, and other engagement methodologies. In some examples, a feature can be formed in the frame member, for example, while the positioning apparatus is supporting the member via one or more bosses. In some examples, a feature can be formed by an additive manufacturing process, a subtractive manufacturing process, or combinations thereof. For example, a feature can be formed in the member by a subtractive process such as machining, etching, laser-based processes, cutting, grinding, and other subtractive processes. In other examples, a feature can be formed in or on the member by an additive process, such as a deposition process, a 3D printing process, and similar additive processes. In yet other examples, multiple processes can be used to form a feature or features in the member. Further, multiple features can be formed in or on the member.

In some examples, one or more of the bosses that were joined to the member can be removed from the member, such as, for example, to form the element or component. In some instances, a boss can be completely removed from the member so that substantially no material from the boss remains joined or adhered to the member. In other examples, however, only a portion of a boss can be removed from the member, while some other portion or amount of material from the boss remains joined or adhered to the member. A boss or a portion of a boss can be removed by any desired process. For example, a boss or a portion of a boss can be removed from the member by processes such as machining, etching, laser-based processes, cutting, grinding, and similar processes. In some examples where material is removed from the boss and at least a portion of boss material remains joined to the member, removing such material can form one or more features on the frame member. For example, a boss can be joined to the member at a desired position and material can subsequently be removed from the boss to form a protruding feature on the member out of the joined boss material.

The member, including the features formed on or in the member, can be subjected to further processing or treatment after removing a boss or bosses. For example, the formed element or component can be subjected to surface treatment processes, further additive or subtractive manufacturing processes, or assembly processes to form a component or an electronic device, as described herein.

According to some aspects of the present disclosure, an electronic device can include a frame, an enclosure, or a housing at least partially defining an interior volume and an exterior surface of the electronic device. In some examples, the electronic device can include one or more display components and a transparent cover disposed adjacent to a major surface of the one or more display components and at least partially defining an exterior surface of the electronic device. Additionally, the device can include an encapsulating material that at least partially surrounds one or more of the display components and bonds directly to the frame, enclosure, or housing. In some examples, the encapsulating material can be positioned within the interior volume of the electronic device.

In some examples, the display and/or display components can be components for an LCD display, an LED display, an OLED display, a plasma display, a quantum dot display, or any other type of display known in the art or developed in the future. In some examples, the transparent cover can include any type of transparent material and can be, for example, glass, plastic or polymer material, or ceramic material such as sapphire. In some examples, the encapsulating material can be any form of desirable moldable material. For example, the encapsulating material can include a polymer material, such as an epoxy or resin. In some examples, the encapsulating material can be a composite material, such as a ceramic or glass reinforced polymer material. Alternatively, the moldable material can be a curable material, or a material that can be heated to a moldable form and then cooled to a solid form.

In some examples, the encapsulating material can at least partially surround the periphery of a display or display component. For example, where a display or display component can be substantially rectangular, the encapsulating material can at least partially surround, one, two, three, or all of the display or display components. The encapsulating material can surround substantially the entire periphery of a display or display component. Alternatively, the encapsulating material can at least partially surround a major surface of the display or display component. For example, the encapsulating material can at least partially surround the bottom major surface of a display component.

In some examples, the encapsulating material can be joined or bonded directly to the frame, housing, or enclosure of the electronic device. The encapsulating material can be joined to the frame, housing, or enclosure by any method known in the art or discovered in the future. For example, the encapsulating material can mechanically engage a feature on the frame, housing, or enclosure. In some examples, the encapsulating material can be joined by a chemical bond to the material of the frame, housing, or enclosure. In other examples, an adhesive can be used to join the encapsulating material to the frame, housing, or enclosure. Even though the encapsulating material may not directly contact the material of the frame, housing, or enclosure, the joining of the encapsulating material to the frame, housing, or enclosure with an adhesive is still considered to be direct bonding, as used herein. Alternatively, the encapsulating material itself can be or include an adhesive and can thus directly adhere to the frame, the housing, or the enclosure.

In some examples, the joined encapsulating material can physically support and/or retain the display or display components in a desired position in the electronic device. The encapsulating material can have shock absorbing properties, and can have a desired amount of flexibility, compressibility, or pliability so as to inhibit mechanical stresses that can be experienced by the frame, housing, or enclosure from extending to the display. Accordingly, the display can be positioned substantially closer to an edge of the frame, housing, or enclosure than in instances where traditional components are used to retain the display in the device. For example, the display can be positioned within about 1 millimeters, about 2 millimeters, about 3 millimeters, about 5 millimeters, or about 10 millimeters of an exterior surface of the display. In some examples, the display can be positioned such that the transparent cover can be substantially adjacent to the frame, housing, or enclosure.

In some examples, methods of forming an electronic device can include at least partially surrounding a display component with an encapsulating material, such as the encapsulating material described above. The encapsulating material can be provided to the display component in a moldable form to at least partially surround the display component. In some examples, the encapsulating material can be joined to the frame, housing, or enclosure while in a moldable form. In other examples, however, the encapsulating material can be hardened, cured, cooled, or otherwise solidified around the display component and then joined to the frame, housing, or enclosure. In some examples, the transparent cover can be positioned adjacent to a major surface of the display component prior to encapsulation. Alternatively, however, the transparent cover can be positioned adjacent to a major surface of the display component after the display component has been encapsulated, or even after the display component has be retained, by joining the encapsulating material to the frame, housing, or enclosure.

These and other embodiments are discussed below with reference to FIGS. 1-20. The detailed description given herein with respect to these figures, however, is for explanatory purposes only and should not be construed as limiting.

FIG. 1 illustrates a perspective view of an embodiment of an electronic device 100. The electronic device 100 shown in FIG. 1 is a mobile wireless communication device (a smartphone, for example). The smartphone of FIG. 1 is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device or a consumer device.

The electronic device 100 can have a housing that includes a band or a frame 102 that defines an outer perimeter of the electronic device 100. The band 102, or portions thereof, can be or include a composite component, as described herein. In some examples, the band 102 can include several sidewall components, such as a first sidewall component 104, a second sidewall component 106, a third sidewall component 108 (opposite the first sidewall component 104), and a fourth sidewall component (not shown in FIG. 1). The aforementioned sidewall components can be or include a composite component, as described herein.

In some instances, some of the sidewall components form part of an antenna assembly (not shown in FIG. 1). As a result, a non-metal material, or materials, can separate the sidewall components of the band 102 from each other in order to electrically isolate the sidewall components. For example, a first separating material 112 separates the first sidewall component 104 from the second sidewall component 106, and a second separating material 114 separates the second sidewall component 106 from the third sidewall component 108. The aforementioned materials can include an electrically inert, or insulating, material(s), such as plastics and/or resin, as non-limiting examples.

The electronic device 100 can further include a display assembly 116 (shown as a dotted line) that is covered by a protective cover 118. The display assembly 116 can include multiple layers (discussed below), with each layer providing a unique function. The display assembly 116 can be partially covered by a border 120, or frame, that extends along an outer edge of the protective cover 118 and partially covers an outer edge of the display assembly 116. The border 120 can be positioned to hide or obscure any electrical and mechanical connections between the layers of the display assembly 116 and flexible circuit connectors. Also, the border 120 can exhibit a uniform thickness. For example, the border 120 can include a thickness that generally does not change in the X- and Y-dimensions.

Also, as shown in FIG. 1, the display assembly 116 can include a notch 122, representing an absence of the display assembly 116. The notch 122 can allow for a vision system (discussed below) that provides the electronic device 100 with information for object recognition, such as facial recognition. In this regard, the electronic device 100 can include a masking layer with openings (shown as dotted lines) designed to hide or obscure the vision system, while the openings allow the vision system to provide the object recognition information. This will be further discussed below. Also, the protective cover 118 can be formed from a transparent material, such as glass, plastic, sapphire, or similar transparent materials. In this regard, the protective cover 118 can be referred to as a transparent cover, a transparent protective cover, or a cover glass (when the protective cover 118 includes glass). As shown in FIG. 1, the protective cover 118 includes an opening 124, which can represent a single opening of the protective cover 118. The opening 124 can allow for transmission of acoustical energy (in the form of audible sound) into the electronic device 100, which can be received by a microphone (not shown in FIG.

1) of the electronic device 100. Further, the opening 124 can allow for transmission of acoustical energy (in the form of audible sound) out the electronic device 100, which can be generated by an audio module (not shown in FIG. 1) of the electronic device 100. Also, the electronic device 100 may not include, according to some embodiments, a button, such as "home button," commonly found in electronic devices.

The electronic device 100 can further include a port 126 designed to receive a connector of a cable assembly. The port 126 allows the electronic device 100 to communication data information (send and receive), and also allows the electronic device 100 to receive electrical energy to charge a battery assembly. Accordingly, the port 126 can include terminals that electrically couple to the connector.

Furthermore, the electronic device 100 can include several openings. For example, the electronic device 100 can include openings 128 that allow an additional audio module (not shown in FIG. 1) of the electronic device to emit acoustical energy out of the electronic device 100. The electronic device 100 can further include openings 132 that allow a microphone of the electronic device to receive acoustical energy. The electronic device 100 can also include a first fastener 134 and a second fastener 136 designed to be fastened to a rail that is coupled to the protective cover 118. In this way, the first fastener 134 and the second fastener 136 can be designed to couple the protective cover 118 with the band 102.

The electronic device 100 can include several control inputs designed to provide a command to the electronic device 100. For example, the electronic device 100 can include a first control input 142 and a second control input 144. The aforementioned control inputs can be used to adjust the visual information presented on the display assembly 116 or the volume of acoustical energy output by an audio module, as non-limiting examples. The controls can include one of a switch, a sensor, or a button designed to generate a command to a processor circuit. The control inputs can at least partially extend through openings in the sidewall components. For example, the second sidewall component 106 can include an opening 146 that receives the first control input 142. Further details of an exemplary electronic device are provided below with reference to FIG. 2.

Figure 2:
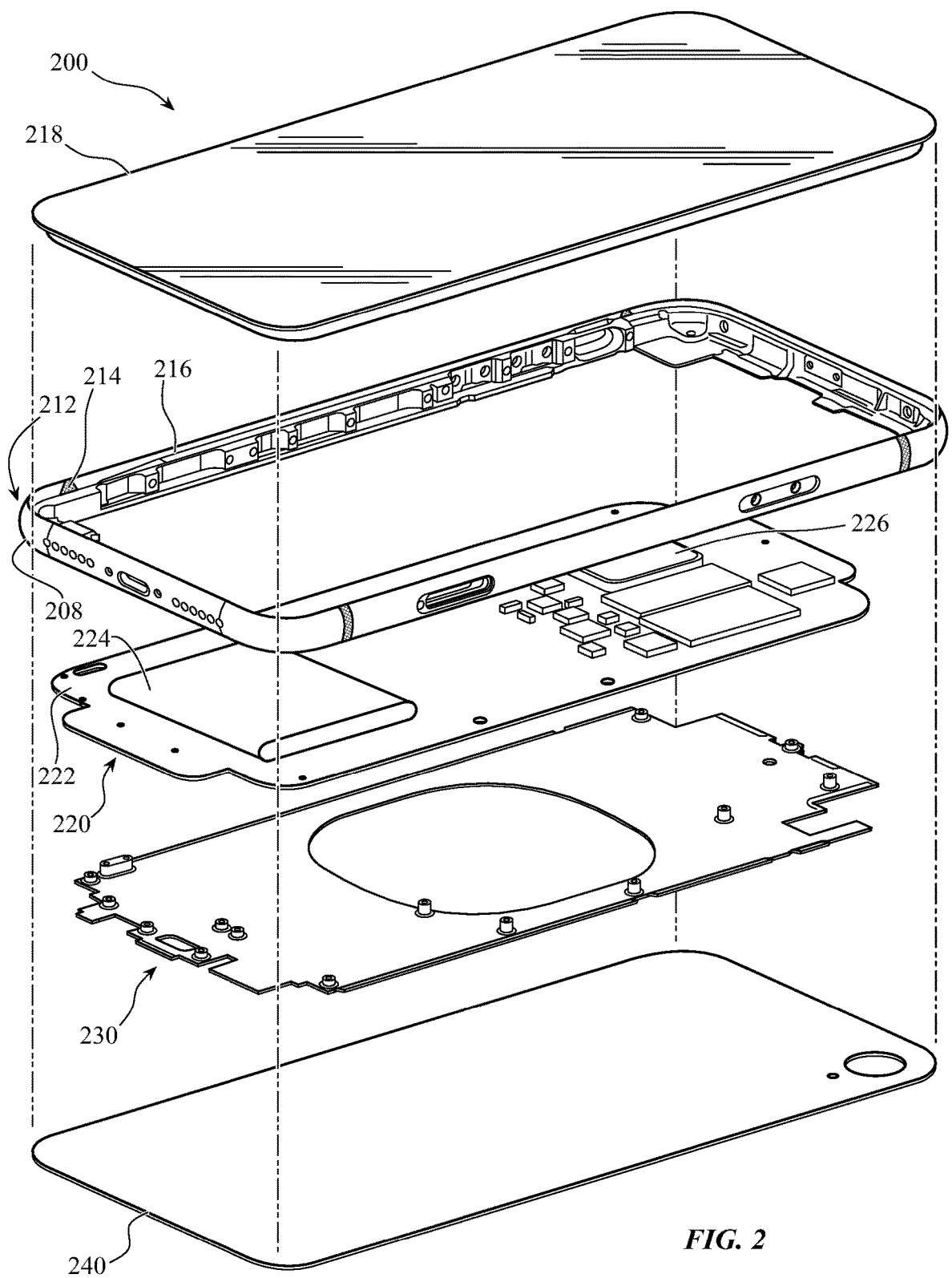
FIG. 2 shows an exploded view of an electronic device.

FIG. 2 illustrates an exploded view of an electronic device 200. The electronic device 200 shown in FIG. 2 is a smartphone, but is merely one representative example of a device that can include or be used with the systems and methods described herein. As described with respect to electronic device 100, electronic device 200 can also correspond to any form of wearable electronic device, a portable media player, a media storage device, a portable digital assistant ("PDA"), a tablet computer, a computer, a mobile communication device, a GPS unit, a remote control device, and other electronic devices. In some examples, the electronic device 200 can include some or all of the features described herein, with respect to electronic device 100.

The electronic device 200 can have a housing that includes a band 202 that at least partially defines an exterior portion, such as an outer perimeter of the electronic device. As with the band 102 described above in FIG. 1, the band 202 can include several sidewall components, such as a first sidewall component 204, a second sidewall component 206, a third sidewall component 208 (opposite the first sidewall component 204), and a fourth sidewall component 210. The aforementioned sidewall components can be or can include a composite component, as described herein. The band 202 can also include a non-metal material or materials that separate and/or join the sidewall components of the band 202 with each other, as described herein. For example, separating material 214 can separate and/or join the second sidewall component 206 with the third sidewall component 208.

The housing, including the band 202, can include one or more features to receive or couple to other components of the device 200, such as feature 222. For example, the band 202 can include any number of features such as apertures, cavities, indentations, and other mating features configured to receive and/or attach to one or more components of the device 200. The electronic device 200 can include internal components such as processors, memory, circuit boards, batteries, and sensors. Such components can be disposed within an internal volume defined, at least partially, by the band 202, and can be affixed to the band 202, via internal surfaces, attachment features such as feature 222, threaded connectors, studs, posts, and/or other fixing features, that are formed into, defined by, or otherwise part of the band 202.

The device 200 can include internal components, such as a system in package (SiP) 226, including one or more integrated circuits such as a processors, sensors, and memory. The device 200 can also include a battery 224 housed in the internal volume of the device 200. The device 200 can also include one or more sensors, such as optical or other sensors, that can sense or otherwise detect information regarding the environment exterior to the internal volume of the device 200. Additional components, such as a haptic engine, can also be included in the device 200. The electronic device 200 can also include a display assembly 216, similar to display assembly 116 described herein. In some examples, the display assembly 216 can be received by and/or attached to the band 202 by one or more attachment features.

The electronic device 200 can further include a chassis 220 that can provide structural support. The chassis 220 can include a rigid material, such as a metal, or can include a composite construction, as described herein. The chassis 220 can also be coupled to the band 202. In this manner, the chassis 220 can provide an electrical grounding path for components electrically coupled to the chassis. The electronic device can alternatively or additionally include a back plate 230 having cladding layers and/or other attachment features such that one or more components of the electronic device 200 can be attached to the back plate 230, for example via welding. The back plate 230 can form conductive pathways for connecting components of the electronic device 200. In some examples, the back plate 230 can be attached to the band 202 of the device 200 by one or more attachment features, such as feature 222.

An exterior surface of the electronic device 200 can further be defined by a back cover 240 that can be coupled with the band 202. In this regard, the back cover 240 can combine with the band 202 to form an enclosure or a housing of the electronic device 200, with the enclosure or housing (including band 202 and back cover 240) at least partially defining an internal volume. The back cover 240 can include a transparent material, such as glass, plastic, sapphire, or another transparent material.

The housing, including the band 202 of one or more composite components can be conformable to interior dimensional requirements, as defined by the internal components. For example, the structure of the housing including a composite band 202 can be defined or limited exclusively or primarily by the internal components the housing is designed to accommodate. That is, because a housing including a composite band 202 can be extremely light and strong, the housing can be shaped to house the interior components in a dimensionally efficient manner without being constrained by factors other than the dimensions of the components, such as the need for additional structural elements. The composite components 204, 206, 208, 210 of the band can be formed by a variety of processes, as discussed herein. In some embodiments, these formation processes can allow for the housing and/or band 202 to have a detailed shape or design that is tailored specifically to satisfy one or more needs, such as internal dimensional requirements, without the need for additional features to reinforce the structure of the housing. Additionally, artifacts of the manufacturing process of the housing can be eliminated. Furthermore, other components of the electronic device 200, such as individual internal structural components like the chassis 220 or exterior input components, can be formed from or can include a composite component, as described herein.

While any number or variety of components of an electronic device, for example electronic device 200, can be formed from or can include a composite component, the structure of these composite components can be, for example, a composite component including an exterior portion joined to an interior portion as described herein. The structure and materials of the exterior and interior portion, as well as the composite component itself, can apply not only to the specific examples discussed herein, but to any number or variety of embodiments in any combination. Various embodiments of composite components are described below with reference to FIG. 3.

Figure 3:
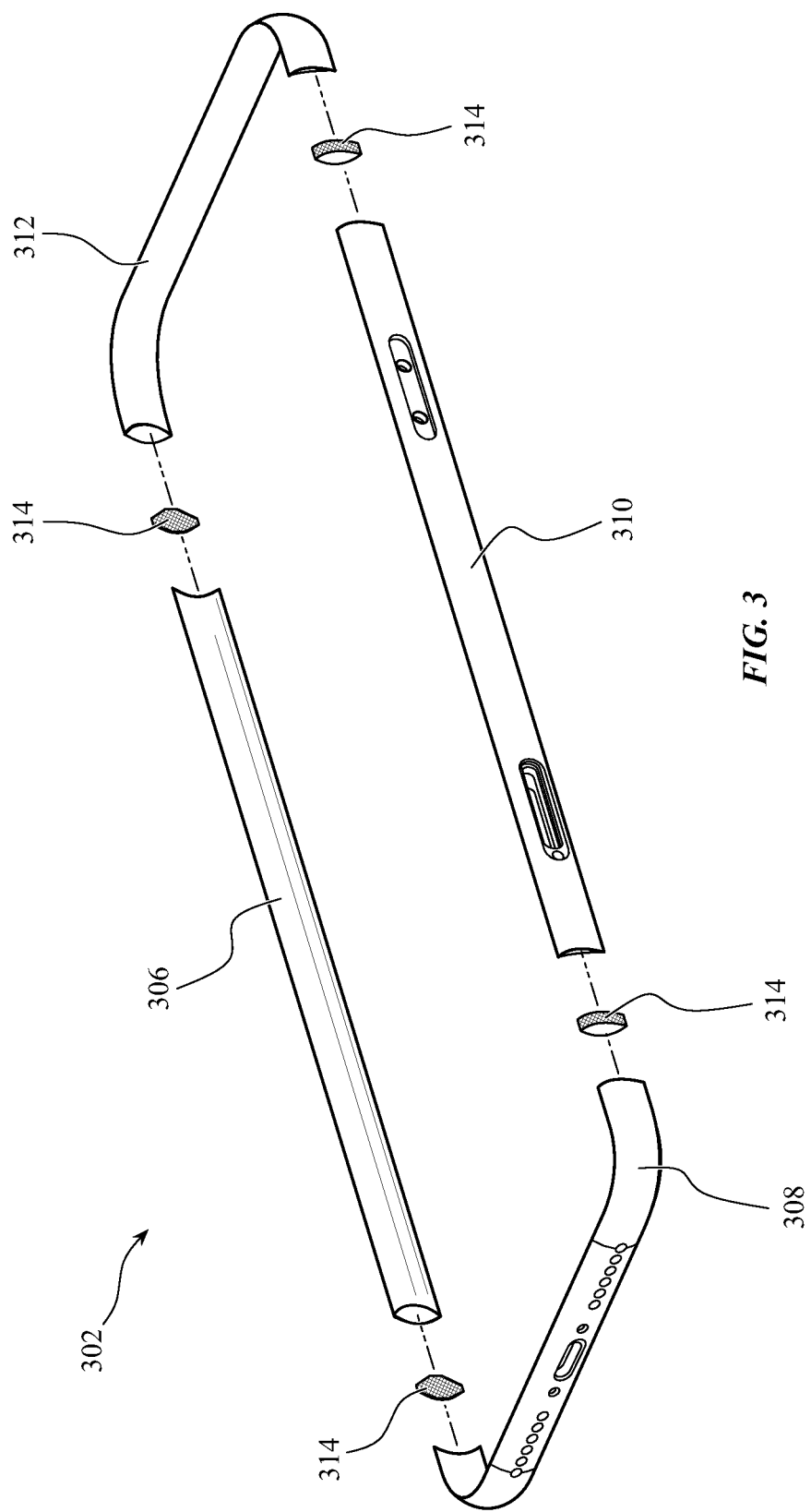
FIG. 3 shows an exploded view of a housing of an electronic device.

FIG. 3 shows an exploded view of a band 302 of a housing or enclosure of an electronic device, for example electronic device 100 or electronic device 200 described with respect to FIGS. 1 and 2. The band 302 can include one or more portions that are composite components or that include composite components, such as an exterior portion joined to an interior portion, as described herein. For example, the band 302 can include a first composite sidewall component 306, a second composite sidewall component 308, a third composite sidewall component 310 (opposite the first composite sidewall component 306), and a fourth composite sidewall component 312. In some examples, and as described herein, the composite components 306, 308, 310, 312 can be separated and/or joined together by a material 314 that can include an electrically inert, or insulating, material(s), such as plastics and/or resin, as non-limiting examples.

Although the embodiment illustrated in FIG. 3 includes a band 302 having multiple composite sidewall components 306, 308, 310, 312 that are joined together, in some examples a housing or enclosure for an electronic device can include or be formed form a single composite component having an interior and exterior portion as described herein. Further, in some examples the composite components can form portions of the housing or enclosure other than the sidewalls, such as a top portion, bottom portion, or any portion of the housing or enclosure. Further details of the composite sidewall components 306, 308, 310, 312 are provided below with reference to FIGS. 4A-8.

Figure 4A:
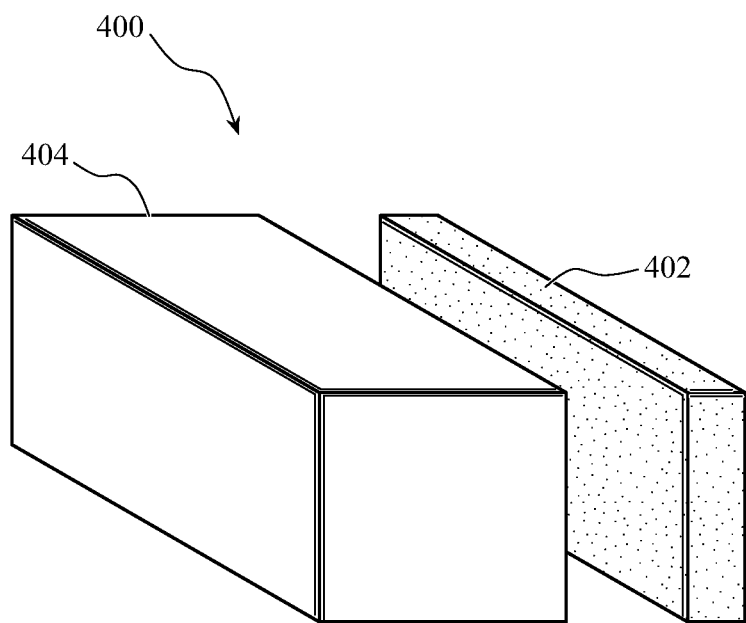
FIG. 4A shows an exploded perspective view of a component of an electronic device.

FIG. 4A shows a perspective view of a composite component 400 including an outer or exterior portion 402 and an inner or interior portion 404. Although illustrated in an exploded view, the composite component 400 can include an outer or exterior portion 402 that is joined or bonded to the inner or interior portion 404. In some examples, the exterior portion 402 can be pre-formed and can include a metallic material, such as stainless steel, although other materials are expressly contemplated, as described herein. In some examples, the exterior portion can have a thickness greater than about 25 microns. The interior portion 404 can have a second, different set of material properties that are independent of the first set of material properties of the outer portion 402. In some examples, the exterior portion 402 and the interior portion 404 can be welded, bonded, adhered, or otherwise joined together such that they form the housing, or a portion thereof, and act as a composite body 400. That is, in some cases, the composite body 400 can be treated as a single piece of material with any process, such as the processes described herein, including manufacturing and assembly processes. The exterior portion 402 and the interior portion 404 can include any desired shape or design, and thus the component 400 can include any desired shape or design. In some examples, the component 400 can be a portion of a housing of an electronic device. In some other examples, however, the component 400 can be any component of an electronic device, such as a structural component, an internal component, an external component, and any other component.

Figure 4B:
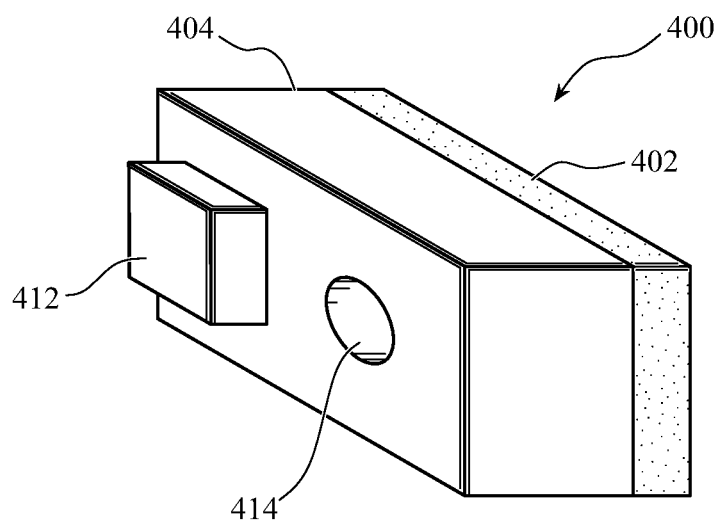
FIG. 4B shows a perspective view of a component of an electronic device.

FIG. 4B shows a perspective view of a simplified composite component 400, for example, as shown in FIG. 4A, including features 412 and 414 formed in and at least partially defined by the interior portion 404. The features 412, 414 can include protruding features, recessed features, or combinations thereof. In some examples, a feature, such as feature 412, can be formed by an additive manufacturing process. In some examples, a feature, such as feature 414, can be formed by a subtractive manufacturing process. In some examples, a feature can include an aperture, a recess, a blind hole, a cavity, a protrusion, or combinations thereof. A feature 412, 414 can be an attachment feature for one or more other components of an electronic device. The component 400 and concepts illustrated in FIGS. 4A and 4B can be applied to any of the composite components described herein, in any combination. Further, examples including the concepts and features discussed with respect to FIGS. 4A and 4B are described below with reference to FIGS. 5-8.

Figure 5:
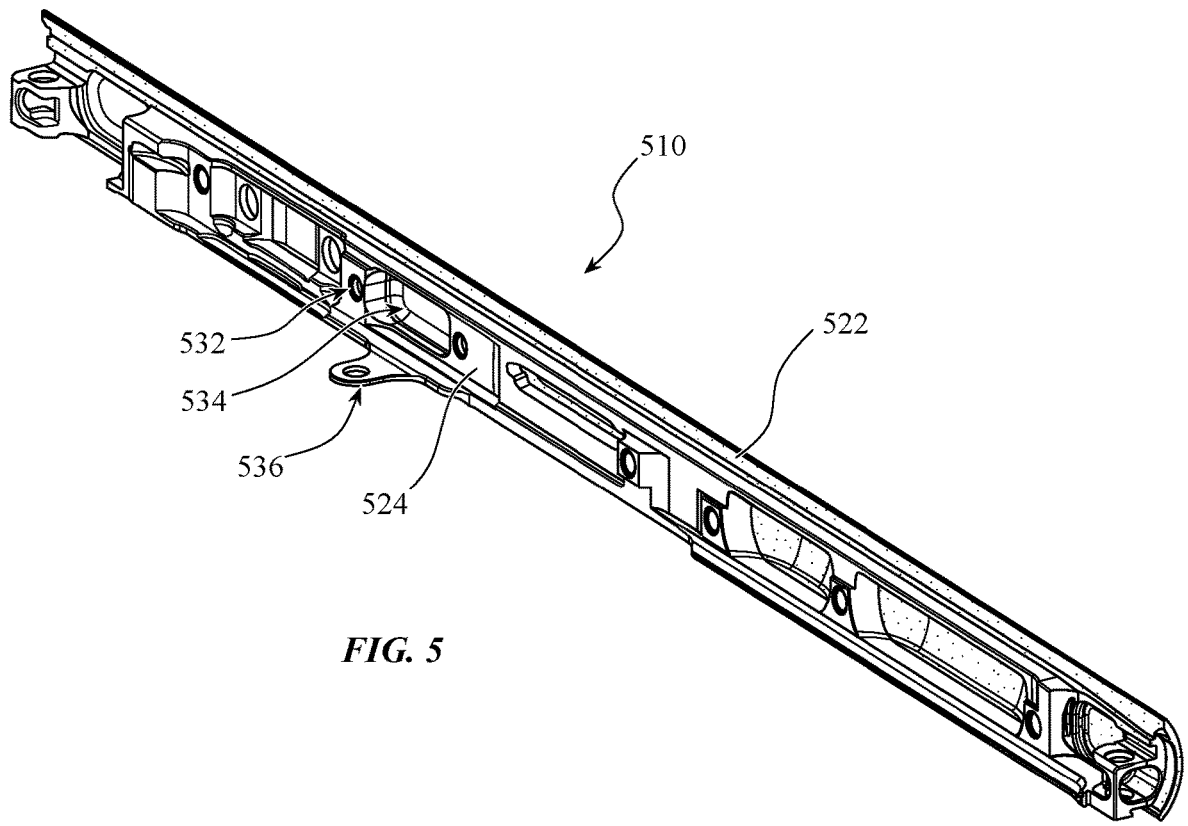
FIG. 5 shows a perspective view of a portion of a housing of an electronic device.

FIG. 5 shows a composite component 510 that can be similar to or include the features of the composite sidewall components 304, 306, 308, 310 described with respect to FIG. 3 and component 400 described with respect to FIGS. 4A-4B. The composite component 510 can include an outer or exterior portion 522 that is joined to an inner or interior portion 524. In the present example, the exterior portion 522 can at least partially define an exterior surface of a housing or enclosure of an electronic device. The interior portion 524 can at least partially define a surface of an internal volume of the electronic device. As can be seen in FIG. 5, the composite component 510 can include a number of features 532, 534, 536, that can, for example, act as attachment features for other components of an electronic device.

In some examples, the features can be formed in one or both of the exterior portion 522 and the interior portion 524 of the composite component 510. For example, the interior portion 524 of the composite component 510 can include a feature, such as aperture 532. In some examples, the feature 532 can be an aperture, a recess, a blind hole, or other feature formed in the interior portion 524 by a subtractive process, such as a machining or an etching process. In some examples, the feature 532 can act as an attachment feature for other components of the electronic device. The feature 532 can be configured to receive components of an electronic device, such as buttons or input components. Although depicted as an aperture 532, the feature 532 can take any desired form or shape. In some examples, the feature 532 can extend, at least partially, into the interior portion 524 to a desired depth. Alternatively, however, the feature 532 can extend substantially entirely through an entire thickness of interior portion 524.

In some examples, a feature can be formed in both the exterior portion 522 and the interior portion 524 of the composite component 510. For example, feature 534 can be formed in, or be defined by, both the exterior and the interior portions 522, 524 of the component 510. Feature 534 can be an aperture or a through hole that passes at least partially through the exterior portion 522 and the interior portion 524. Further, although the portions 522, 524 are illustrated as having a relatively uniform thickness, in some examples, the thickness of the exterior portion 522 and/or interior portion 524 can vary at locations where features, such as feature 534, are formed. A protruding feature, such as feature 536, can be formed in the interior portion 524, for example, by a machining process or an additive manufacturing process, and can serve as an attachment feature for other components of an electronic device. Although depicted as a protrusion defining an aperture therethrough, the feature 536 can include any desired shape or design.

As described herein, the interior portion 524 of the composite component 510 can be selected such that it has a set of material properties that are desirable for the formation of features, such as features 532, 534, 536. For example, the material of the interior portion 524 can be selected to have a material property or set of material properties that allow for the interior portion 524 to be highly machinable without causing high levels of wear on machining tools. Additionally, the material of the interior portion 524 can be relatively inexpensive so that waste material produced by forming the features does not substantially increase production costs. Further, as described herein, the material of the exterior portion can be selected to have a material property or set of material properties, independent of the material properties of the interior portion, that allow the exterior portion 522 to have, for example, high levels of hardness and corrosion resistance.

In some examples, the features formed in one or both of exterior portion 522 and interior portion 524, such as features 532, 534, 536, can have a major dimension from about a micron up to about a millimeter, or several millimeters or more. In some cases, a feature, such as feature 536 can have a major dimension from about 100 microns to about 1 millimeter. Further, in some examples, a feature, such as feature 536, can have minor dimensions from about 100 microns to about 1 millimeter.

Further, as can be seen in FIG. 5, the exterior portion 522 can have a substantially curved shape or profile that can correspond to an exterior profile of the electronic device. The exterior portion 522 can have any desired shape or profile. In some examples where the exterior portion has a substantially curved shape or profile, the interior portion 524 can be positioned entirely behind or within a curve defining the curved profile of the exterior portion 522. Additional details of the exterior portion 522 are provided below with reference to FIG. 6.

Figure 6:
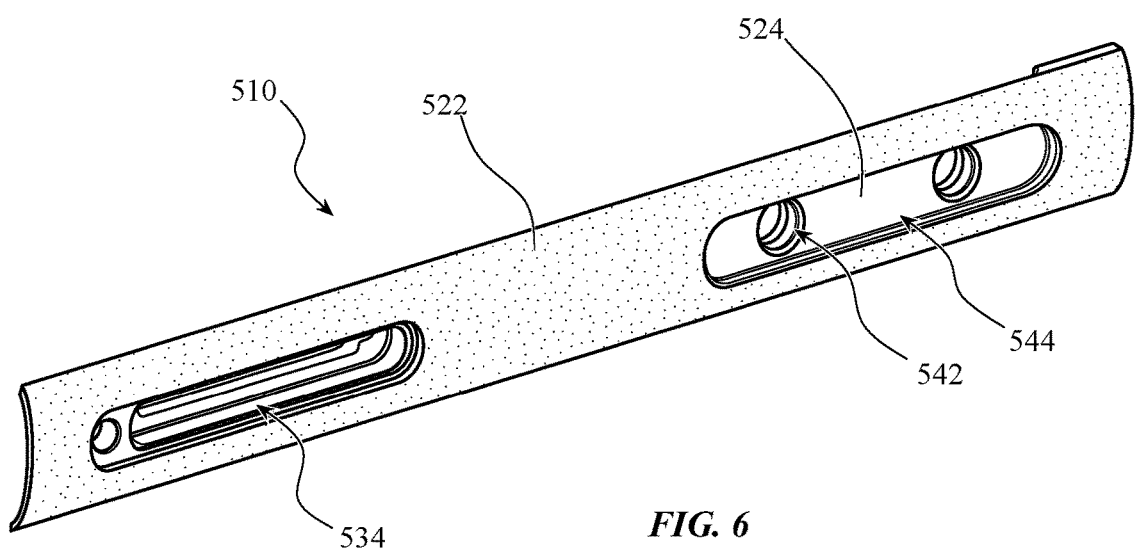
FIG. 6 shows another perspective view of the portion of the housing of FIG. 5.

FIG. 6 shows another perspective view of the composite component 510 of the housing of FIG. 5. As can be seen in FIG. 6, one or more areas, such as area 538, of the exterior portion 522, can be removed so that at least some of the interior portion 524 can be exposed. The exposed surface of the interior portion 522 can be subjected to a treatment or other processing in order to, for example, protect the exposed surface of the interior portion 522. In some examples, the exterior portion 522 can include a stainless steel alloy and the interior portion 524 can include aluminum. At area 538, where the aluminum of the interior portion 524 is externally exposed, an interface between the stainless steel of the exterior portion 522 and the aluminum of the interior portion 524 can also be exposed.

In such examples, the interface between the materials of the two portions can form a galvanic contact and one of the materials of the portions 522, 524 can be subjected or prone to galvanic corrosion. Accordingly, areas, such as area 538, where an interface between the materials of the portions 522, 524 is exposed can be processed or treated to prevent or inhibit galvanic corrosion. A material or materials can be deposited over the interface between the portions 522, 524 at area 538 to prevent or inhibit galvanic corrosion. Example material can include, but are in no way limited to, a polymeric material, a metallic material, a ceramic material, or combinations thereof.

Alternatively, the geometry of the exterior portion 522 and/or interior portion 524 can be designed so that an interface between the portions is not exposed, even when features such as feature 538 are formed in the exterior portion 522. For example, the exterior portion 522 can be thicker at the area 538 where a feature is formed so that the interior portion 524 is not exposed, even when material is removed from the exterior portion 524. The interior portion 524 can correspondingly be made thinner at areas where the exterior portion 522 has an increased thickness, so that the composite component 510 maintains a relatively uniform thickness. Alternative views and features of the composite component 510 are detailed below, with reference to FIGS. 7 and 8.

Figures 7, 8:
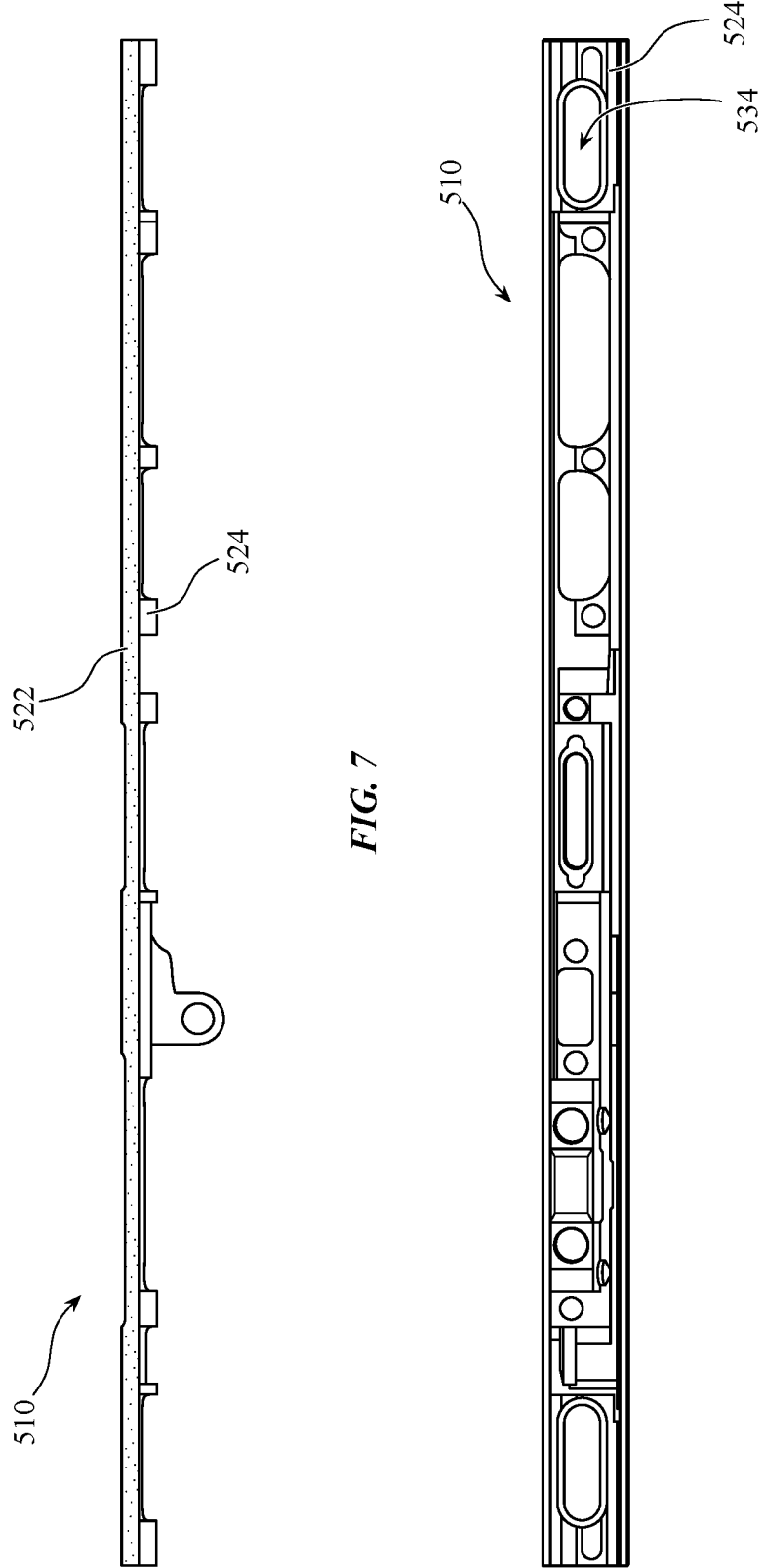
FIG. 7 shows a top view of the portion of the housing of FIG. 5.
FIG. 8 shows a side view of the portion of the housing of FIG. 5.

FIG. 7 shows a top view of the composite component 510 depicted in FIGS. 5 and 6. As can be seen, the thicknesses of one or both of the exterior portion 522 and the interior portion 524 can have a thickness that varies along the length of the component 510. Alternatively, however, the thickness of the exterior portion 522 and/or interior portion 524 can be substantially uniform along the length of the component 510. The exterior portion 522 can have a thickness of greater than about 25 microns, greater than about 50 microns, greater than about 100 microns, 200 microns, 300 microns, 400 microns, 500 microns, or greater. In some examples, the exterior portion can have a thickness of up to about 1 millimeter, up to about 2 millimeters, or up to about 5 millimeters or more. In alternative examples, the interior portion 524 can have any desired thickness or thicknesses. For example, as shown in FIG. 7, the interior portion 524 can have a thickness that varies from about 100 microns up to about several millimeters or more. In some instances, the interior portion can have a thickness that approximates an entire width of the electronic device.

FIG. 8 shows a side view of the composite component 510 depicted in FIGS. 5-7. As described herein, the interior portion 524 can include any number of features that are formed in the material or the interior portion 524, or added or attached to the interior portion 524 by any desired method or process. In some examples, the features, such as feature 534, can serve as attachment features for components of an electronic device, such as an internal component or structural components. Further, in some examples, the interior portion 524 can form or define a surface that at least partially defines an internal volume of an electronic device. In some examples, the exterior portion 522 may not form part of a surface that defines an internal volume of an electronic device. In some instances, however, the exterior portion 522 can form at least part of a surface that defines an internal volume of an electronic device.

While any number or variety of components of an electronic device, for example electronic device 100 or 200, can be formed from or can include a composite component, such as component 210, 310, 400, and/or 510, the structure of these composite components can be, for example, a composite component including an exterior portion joined to an interior portion, as described herein. The structure and materials of the exterior and interior portion, as well as the composite component itself, can apply not only to the specific examples discussed herein, but to any number or variety of embodiments in any combination. Various embodiments of composite components are described below, with reference to FIGS. 9-13.

Figure 9A:
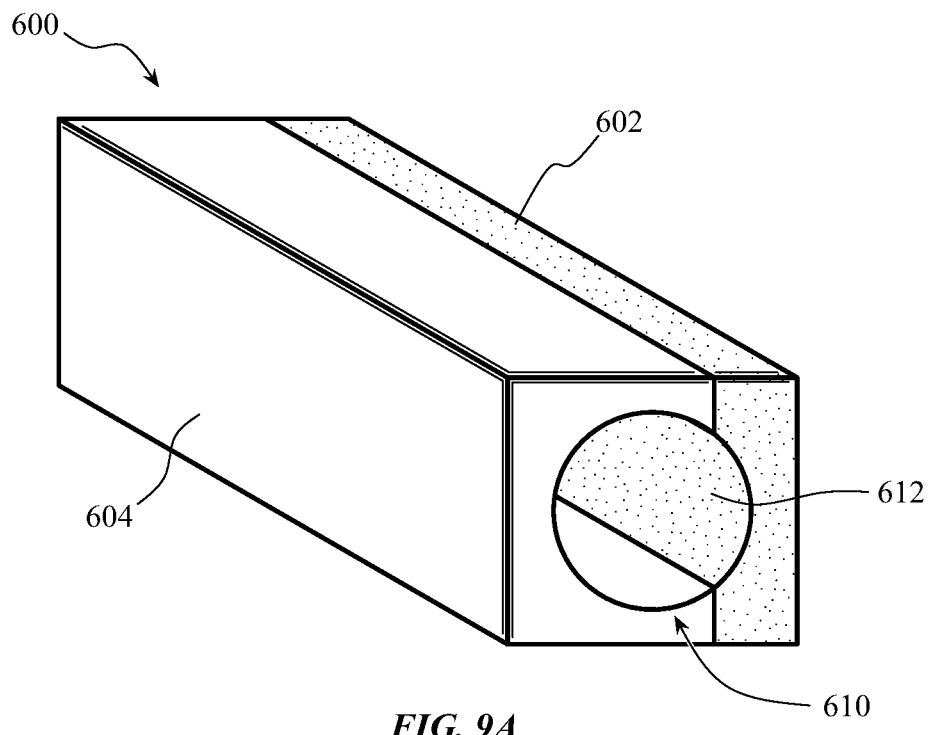
FIG. 9A shows a perspective view of a component of an electronic device.

FIG. 9A shows a simplified perspective view of a composite component 600 including an exterior portion 602 bonded to an interior portion 604, as described herein. In some examples, the exterior portion 602 can include a metal material, although other materials are expressly contemplated, as described herein. The interior portion can include a second material different than the material of the exterior portion and including a second set of material properties independent of the set of material properties of the exterior portion 602. As can be seen in FIG. 9A, the exterior portion 602 and the interior portion 604 can cooperate to at least partially define a surface 610 that can include a feature 612. In some examples, the feature 612 can be a recess, an aperture, a cavity, or other similar feature. In some other examples, however, the feature 612 can include a protrusion or positive feature, or combinations thereof. Such a feature 612 can be, an attachment feature for joining the component 600 to one or more other components for an electronic device.

Figure 9B:
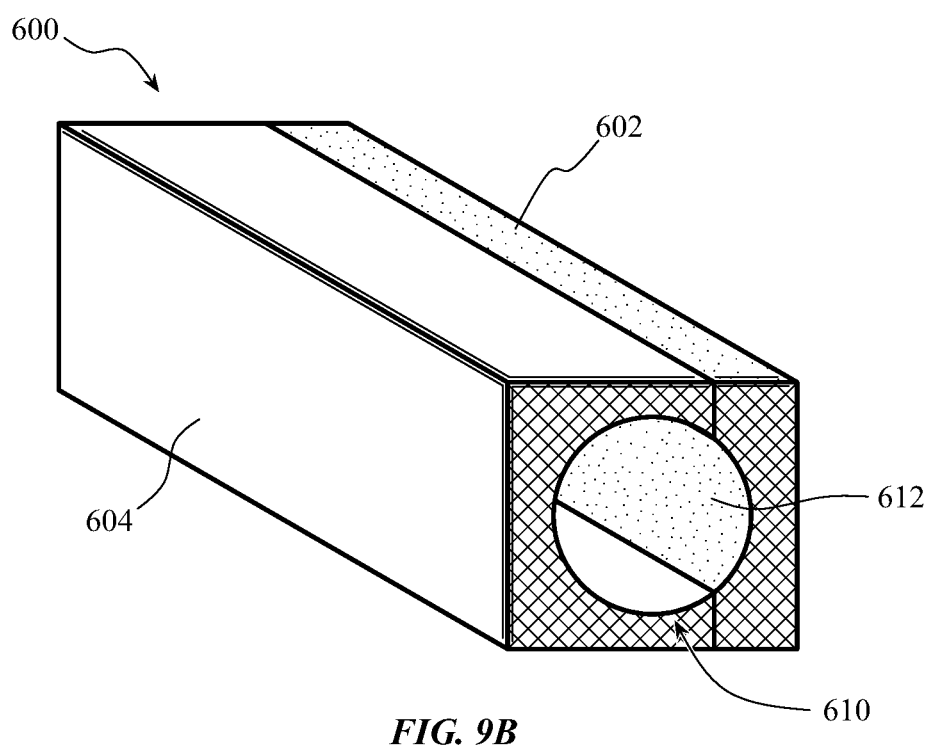
FIG. 9B shows a perspective view of a component of an electronic device.

As shown in FIG. 9B, in some examples, the surface 610 defined by both the exterior portion 602 and the interior portion 604 can be treated or subjected to processing to form one or more features thereon. In some examples, the surface 610 can include one or more engagement features formed thereon. The surface 610 can include multiple engagement features formed on the part of the surface defined by the exterior portion 602, and multiple engagement features formed on the part of the surface defined by the interior portion 604. The engagement features can range in size from nano- or micro-scaled features to macro-scale features having dimensions on the order or millimeters. In some examples, the engagement feature can have any desired shape to engage a moldable material. For example, an engagement feature can include a recess, a protrusion, or combinations thereof.

In some examples, the features can be formed by any number of additive or subtractive processes. In some examples, an engagement feature formation process can form the engagement feature on a part of the surface defined by the interior portion, but may not form an engagement feature on or otherwise substantially damage or degrade the part of the surface defined by the exterior portion 602. In some examples, the treatment process can additionally form an engagement feature on a part of the surface defined by the exterior portion 602, but may not form an engagement feature on or otherwise substantially damage or degrade the part of the surface defined by the interior portion 604.

The component 600 and concepts illustrated in FIGS. 9A and 9B can be applied to any of the composite components described herein, in any combination. Further examples including the concepts and features discussed with respect to FIGS. 9A and 9B are described below with reference to FIGS. 10-13.

Figure 10:
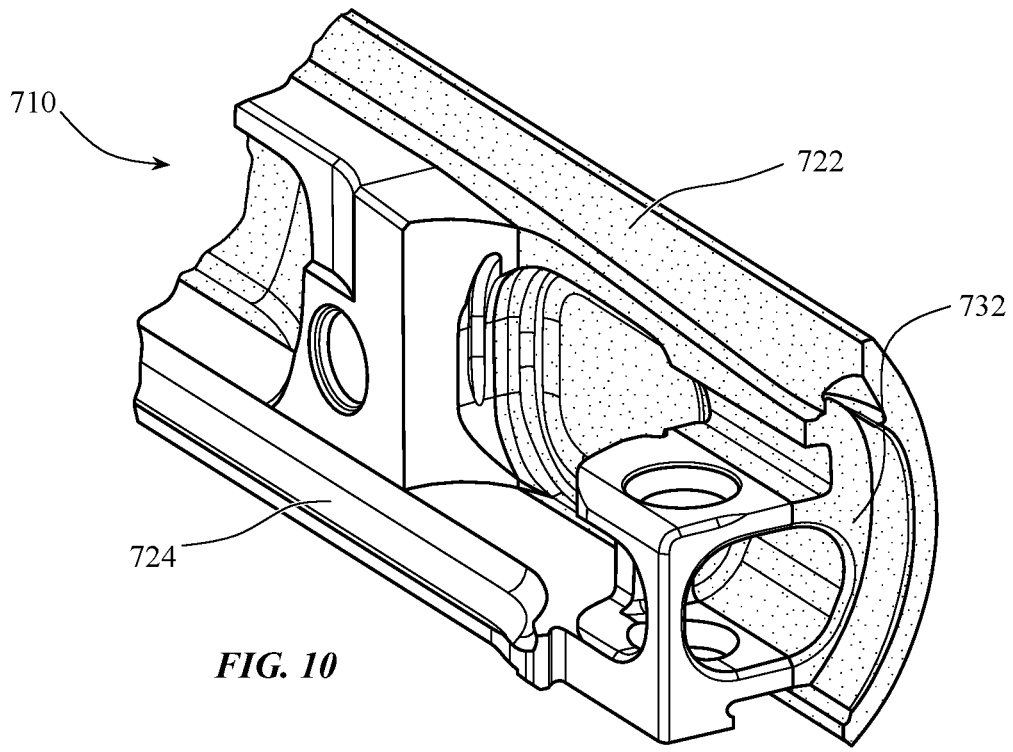
FIG. 10 shows a close-up perspective view of a portion of a housing of an electronic device.

FIG. 10 shows a close-up perspective view of a composite component 710 that can form a housing or enclosure of an electronic device. As with the component 410 depicted in FIG. 5-8, the component 710 can include a pre-formed exterior portion 722 that is joined to an interior portion 724. The exterior portion 722 can include a material or materials having a first set of material properties, while the interior portion 724 can include a material or materials having a second set of material properties independent of the first set of material properties.

As described herein, in some examples, the exterior portion 722 can be directly joined, bonded, or adhered to the interior portion 724. That is, the exterior portion 722 can directly contact, abut, be fused or bonded, or otherwise joined to the interior portion 724. In examples where the exterior portion 722 and the interior portion 724 both include metal materials, the bond between the exterior and interior portions 722, 724 can be a metallurgical bond. In other examples, the exterior portion 722 can directly contact the interior portion 724 along substantially the entire interface, or only at one or more locations. Further, even where the portions 722, 724 are in direct contact along substantially the entire interface, the portions 722, 724 can, in some examples, only be bonded or joined together at one or more locations. For example, the interior portion 724 can be welded to the exterior portion 722 at one or more locations.

In some examples, the interior portion 724 can be joined to the exterior portion 722 by processes such as brazing, diffusion bonding, electron beam welding, ultrasonic welding, laser welding, adhering, for example, with an adhesive, and similar joining methods. In some examples, the portions 722, 724 can be welded together by a pulsed laser welding process, such as a nanosecond pulsed laser welding process. Where a welding process is used, the welding process can be conducted along the interface or seam between the portions 722, 724, or can be conducted through one or both of the portions 722, 724, at any number of desired locations.

As can be further seen in FIG. 10, the composite component 710 can include one or more features, such as feature 732, which are formed from or defined by both the exterior portion 722 and the interior portion 724. In some examples feature 732 can be an attachment feature, for example, for one or more components of an electronic device. Feature 732 can serve alternative or additional purposes and can, for example, serve to reduce the weight of the composite component 710. In some examples, a feature 732 can facilitate the joining of composite component 710 to another composite component, such as band 102 or 202, to form a housing or an enclosure, as described herein. Feature 732 can mechanically engage a material, such as material 114, 214, 314 described herein, to form a band 102, 202.

Figure 11:
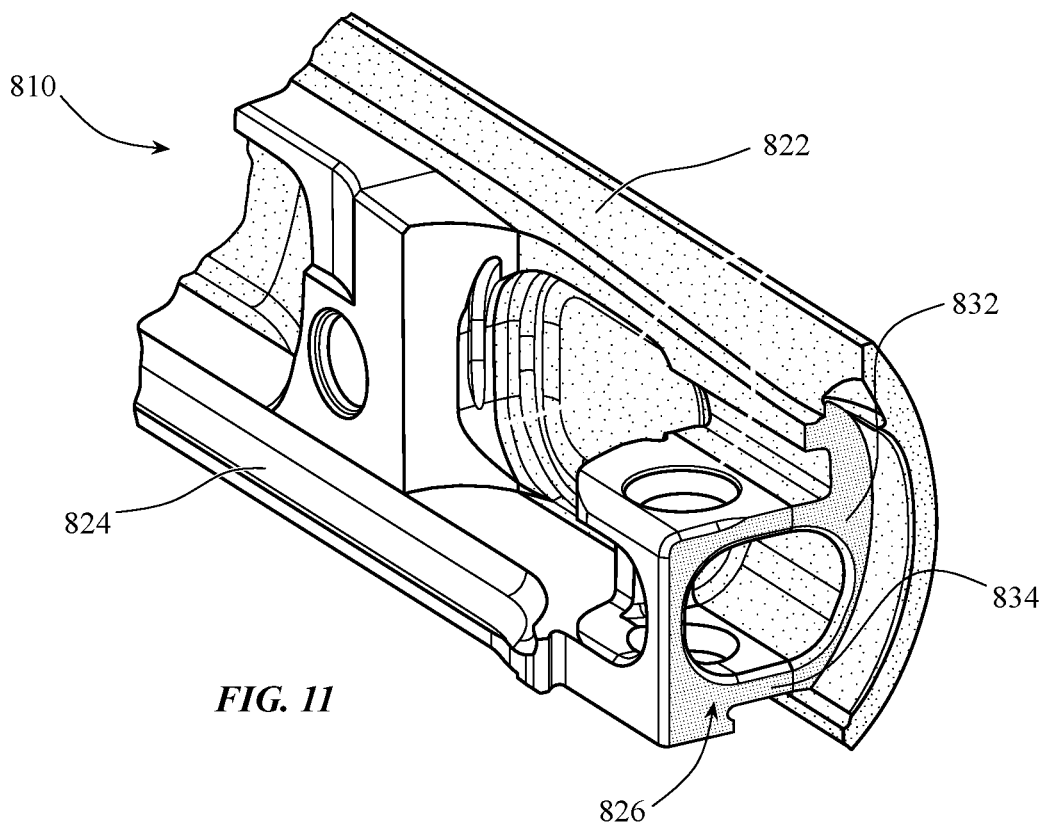
FIG. 11 shows a close-up perspective view of a portion of a housing of an electronic device.

FIG. 11 shows an exemplary composite component 810 that can include a pre-formed exterior portion 822 joined to an interior portion 824. The composite component 810 can include a surface 826 that is defined by both the exterior portion 822 and the interior portion 824. Although the surface 826 is depicted as including an approximately equal area defined by each portion, in some examples, one of the interior or exterior portions 822, 824 can define substantially more of the surface 826 than the other portion.

The surface 826 can include one or more engagement features formed thereon. For example, the surface 826 can include multiple engagement features 832 formed on the part of the surface defined by the exterior portion 822, and multiple engagement features 834 formed on the part of the surface defined by the interior portion 824. As described herein, the engagement features 832, 834 can range in size from nano- or micro-scaled features to macro-scale features having dimensions on the order or millimeters. In some examples, the engagement feature 832, 834 can have any desired shape to engage a moldable material, as described herein. For example, an engagement feature can include a recess, a protrusion, or combinations thereof.

In some examples, the engagement features 832, 834 can allow the composite component 810 to be joined to a second component by mechanical engagement with a moldable material. For example, a moldable material can mechanically engage the engagement features 832, 834 to join the component 810 with a component, such as component 308, illustrated and described with respect to FIG. 3.

Figure 12:
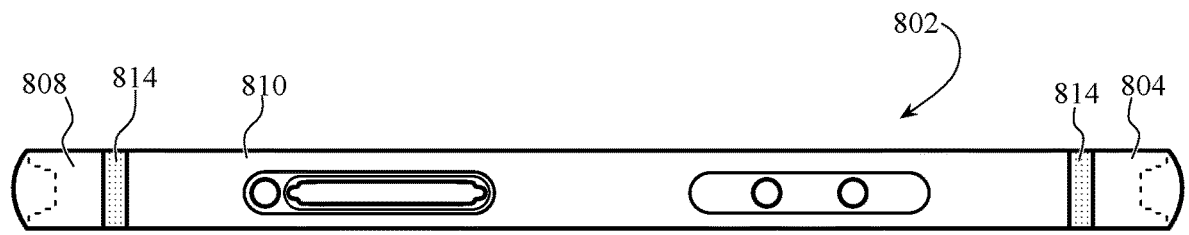
FIG. 12 shows a profile view of a housing of an electronic device.

FIG. 12 illustrates a band 802 that includes component 810, as described above. In some examples, the component 810 can include multiple surfaces defined by the exterior portion 822 and the interior portion 824. For example, component 810 can include a second surface (not shown) opposite the surface 826 that is substantially similar and that also includes engagement features formed thereon. Further, one or more other components of the band 802, such as components 804 and 808, can similarly include engagement features formed on a surface defined by an exterior portion and an interior portion. As shown, a moldable material 814 is disposed between the composite component 810 and the components 804, 808 to which it is joined. The moldable material 814 can include a polymer material, such as epoxy or resin, and can be an electrically insulating material. The moldable material 814 is mechanically engaged with the engagement features 832, 834 of the composite component 810 and can similarly be mechanically engaged with engagement features of component 804. In this way, the moldable material 814 can serve to join the composite component 810 to additional components 804, 808 and thereby form the band 802.

Figure 13:
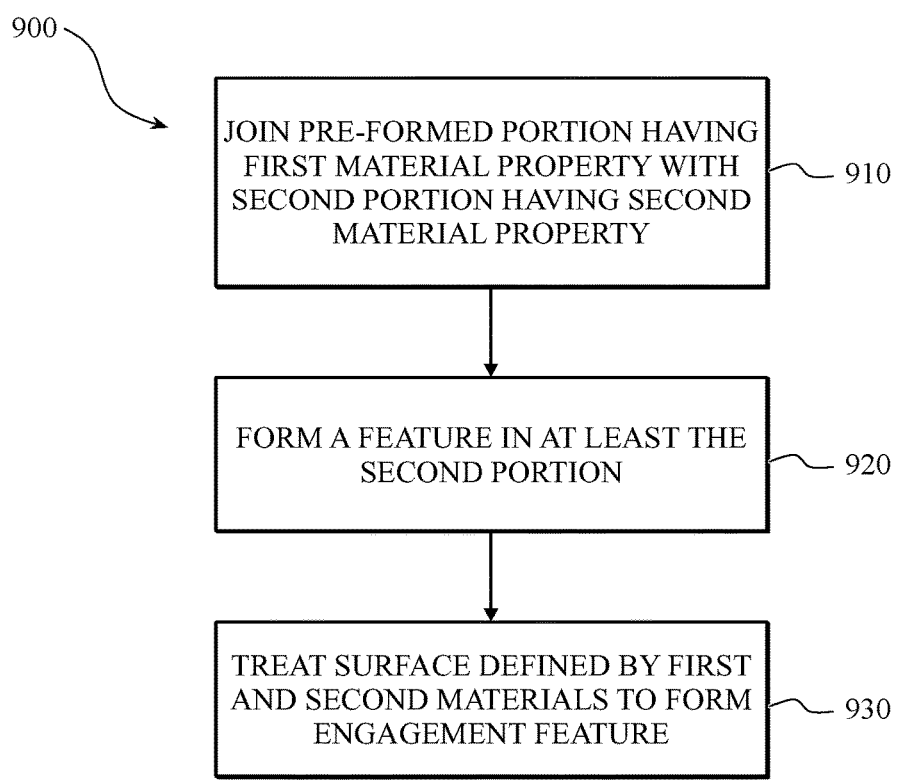
FIG. 13 shows a process flow diagram of a method for forming a component for an electronic device.

FIG. 13 illustrates an exemplary process for forming a composite component for an electronic device having engagement features on a surface, as described herein. The process 900 for forming the composite component can include joining a pre-formed portion, such as an exterior portion including a first material having a first material property or set of material properties, with a second portion, such as an interior portion including a second material having a second material property or set of material properties, at block 910. The process 900 can further include forming one or more features in at least the second portion at block 920, and treating a surface defined by the pre-formed first portion and the second portion to form an engagement feature thereon at block 930.

At block 910, a pre-formed first portion, such as an exterior portion of a composite component can be joined with a second portion, such as an interior portion, as described herein. The pre-formed first portion can include a first material, while the second portion can include a second, independently selected material. In some examples, the materials of the first and second portions can include any of the materials described herein with respect to interior and/or exterior portions of a composite component. In some examples, the pre-formed first portion can be subject to treatment or processing prior to joining, for example to form a desired profile or shape, or to form one or more features therein.

In some examples, the pre-formed first portion can be positioned or held in a desired position, for example by a clamping device or other apparatus, and the second portion can be brought in contact with the pre-formed first portion, whereupon the portions are joined together to form a composite body. The particular process used to join the portions can include any of the processes discussed herein, and can be selected depending on the materials of the pre-formed first portion and the second portion. For example, joining can include directly joining the pre-formed first portion with the second portion by processes such as welding, for example ultrasonic welding or laser welding, brazing, diffusion bonding, fusing, adhering, or other similar methods. Joining can include pulsed laser welding, for example nanosecond pulsed laser welding. In some examples, joining can include mechanically engaging a feature of the pre-formed first portion with a corresponding feature of the second portion, as described herein.

In some examples, joining can alternatively or additionally include providing a layer or material between the pre-formed first portion and the second portion to join the portions together. Thus, in some examples, joining can include providing a material such as an adhesive, glue, heat activated film, polymer material such as epoxy or resin, or other moldable material between the pre-formed first portion and the second portion. This intermediate layer can be provided as a moldable material between the portions in at least some locations and subsequently cured or cooled to join the portions. In some examples, the intermediate material can form a direct bond with the surface of one or both portions, such as a chemical or metallurgical bond. In some examples, the intermediate material can join the portions by alternatively or additionally mechanically engaging with one or more features on a surface of the portions.

In some examples, the second portion can be joined with the pre-formed first portion by providing the second portion to the pre-formed first portion in a moldable form and curing, cooling, or otherwise hardening the material of the second portion. For example, the second portion can be cast, die cast, molded, injection molded, metal injection molded, or otherwise formed into a feature or features of the pre-formed first portion. In some examples, the pre-formed first portion can be present in a mold or other apparatus and the second portion can be provided into the mold to solidify and join with the pre-formed first portion.

In some examples, providing the second portion in moldable form can join the pre-formed first portion and the second portion by forming a bond directly between the materials of the first and second portions, such as a chemical or metallurgical bond. In some examples, the portions can alternatively or additionally be joined, producing a mechanical engagement between the material of the second portion with one or more features formed in or on a surface of the first portion, such as nano-, micro-, and/or macro-scaled features. Thus, in some examples, material of the second portion can flow or otherwise be provided into one or more features of the pre-formed first portion and can be solidified to mechanically engage and join the portions.

Further, in some examples, the first portion, while described as a pre-formed first portion, can be formed substantially simultaneously with the second portion. For example, the first and second portions can be co-extruded or provided in moldable form so that the portions are joined by a chemical bond, a metallurgical bond, mechanical engagement, and other joining methods.

At block 920, one or more features are formed in at least the second portion of the composite component. The feature or features can be formed according to any of the processes or methods described herein, such as additive or subtractive manufacturing processes. For example, one or more features can be formed in at least the second portion by machining, etching, depositing, molding, or other processes. In some examples, the one or more features can be formed in both the pre-formed first portion and the second portion, as described herein.

In some examples, forming one or more features in at least the second component at block 920 can occur substantially simultaneously with the joining step at block 910. For example, where the second portion can be cast or molded into the pre-formed first portion, the one or more features can be formed in the second portion during the molding or casting process when the second portion is solidified, or otherwise formed and joined with the first portion.

At block 930, a surface defined by the pre-formed first portion and the second portion can be treated to form an engagement feature on or in the surface, as described herein. In some examples, an engagement feature can range in size from nano- or micro-scaled features to macro-scale features having dimensions on the order or millimeters. Further, in some examples, the treatment at block 930 can form more than one engagement feature on the surface. The treatment process can include any number of additive or subtractive processes. In some examples, an engagement feature formation process can form the engagement feature on a part of the surface defined by the interior portion, but may not form an engagement feature on or otherwise substantially damage or degrade the part of the surface defined by the exterior portion. In some examples, the treatment process can additionally form an engagement feature on a part of the surface defined by the exterior portion, but may not form an engagement feature on or otherwise substantially damage or degrade the part of the surface defined by the interior portion. That is, in some examples, the treatment at block 930 can form an engagement feature on only a part of the surface defined by one of the interior or exterior portion during one stage, and can form an engagement feature on a part of the surface defined by the other of the interior or exterior portion during a second stage.

In some examples, a stage of the treatment at block 930 can affect or substantially affect only the material of one of the interior or exterior portions. In other examples, however, the part of the surface defined by one of the interior or exterior portions can be masked or otherwise treated so that a stage of the treatment only affects or forms features on the unmasked, or untreated portion. In alternative examples, however, the treatment can form an engagement feature or features on a part of the surface defined by both the interior portion and the exterior portion. The treatment at block 930 can include a subtractive treatment process or processes, such as machining, etching, laser-based processes, cutting, grinding, and similar subtractive processes. In some examples, the treatment at block 930 can include an additive process, such as a deposition process, a thermal spraying process, a 3D printing process, and other similar additive processes. In some examples, the treatment at block 930 can include multiple processes to form the engagement feature or features.

In some examples, the process 900 can further include providing a moldable material, for example moldable material 814 described herein, to the surface including the engagement feature. The moldable material can be provided in moldable or flowable form. The process 900 can further include hardening, curing, cooling, or otherwise solidifying the moldable material to mechanically engage the moldable material with the formed engagement feature. The moldable material can also be mechanically engaged with one or more other components, and can serve to join the components together, for example, as described herein.

While any number or variety of components of an electronic device, such as electronic device 100 or 200, can be formed from or can include a component, such as component 210, 310, 400, 510, 600, 710, and/or 810, the structure of these components can be, for example, a composite component including an exterior portion joined to an interior portion, as described herein. The structure and materials of the exterior and interior portion, as well as the composite component itself, can apply not only to the specific examples discussed herein, but to any number or variety of embodiments in any combination. Various embodiments of components and methods of forming the same are described below with reference to FIGS. 14-19.

Figure 14:
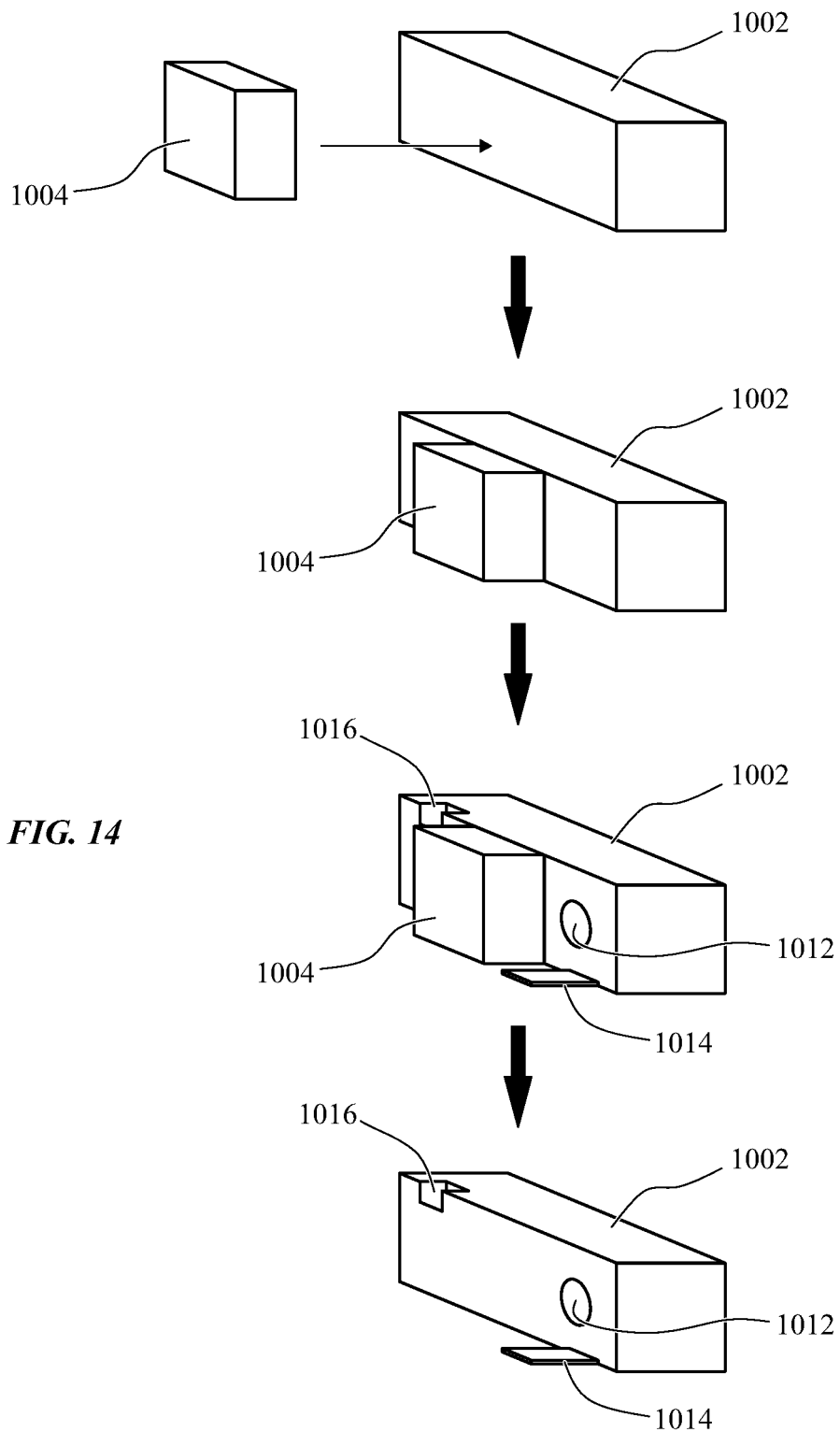
FIG. 14 shows a process flow diagram of stages of a method for forming a component for an electronic device.

FIG. 14 illustrates a flow diagram including various stages of a method for forming an element or component 1002 of an electronic device. The process for forming the element or component 1002 can include joining a boss 1004 to a member 1002, for example, by any desired temporary or permanent methods. In some examples, the boss 1004 can be bonded to the component 1002 by welding or an adhesive. Once bonded to the member 1002, the boss 1004 can be engaged by a positioning apparatus to support, orient, and position the member 1002, for example, during one or more manufacturing processes. In some examples, the positioning apparatus or other device can position the component 1002 in any number of desired positioned, via the boss 1004, while one or more features 1012, 1014, and 1016 are formed therein. As described herein, features can be formed by any combination of additive or subtractive manufacturing processes. In some examples, the features 1012, 1014, and 1016 can include an aperture, a recess, a blind hole, a cavity, a protrusion, or combinations thereof. The boss 1004 can then be optionally removed from the component 1002, however, in some examples, the boss 1004 can at least partially remain on the component 1002 and only some material may be removed from the boss 1004. In those examples, the boss 1004 can be formed into a feature of the component 1002, as described herein.

The component 1002 and concepts illustrated in FIG. 14 can be applied to any of the composite components described herein, in any combination. Further examples including the concepts and features discussed with respect to FIG. 14 are described below, with reference to FIGS. 15-19.

Figure 15:
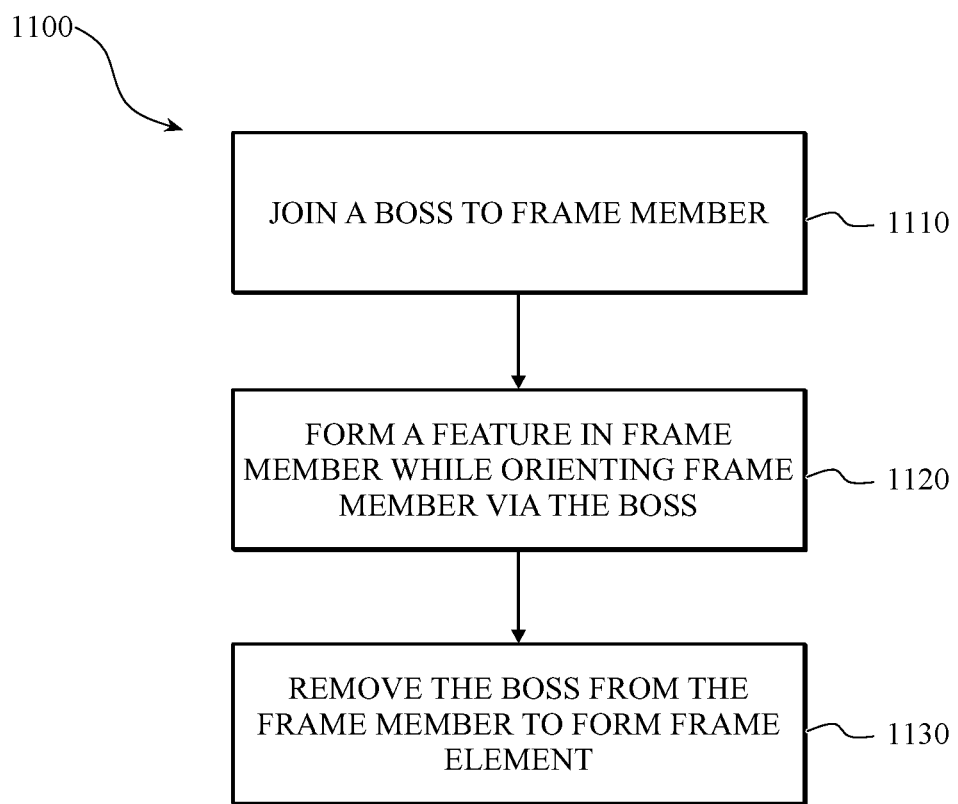
FIG. 15 shows a process flow diagram of a method for forming a component for an electronic device.

FIG. 15 illustrates a process flow diagram of an exemplary process for forming an element or component for an electronic device. The process 1100 for forming the element or component, such as a frame element or component, can include joining a boss to a member at block 1110, forming a feature in the member while orienting the member via the boss at block 1120, and at least partially removing the boss from the member to form the element or component at block 1130.

At block 1110, a boss can be joined to a member, such as a frame member. In some examples, multiple bosses can be joined to the member. The member can assume any desired form and, in some examples, can be a composite member including a pre-formed first portion formed of a first material joined to a second portion formed of a second material, as described herein. In some examples, the boss can be joined to the member either temporarily or permanently, as desired, and as described herein. Any process can be used to join a boss to the member at block 1110. In some examples, the boss can be joined directly to the member, such that a surface of the boss directly contacts, abuts, is fused to, is bonded to, or otherwise is directly joined to the member. Alternatively, the boss can be joined to the member by welding, for example ultrasonic welding or laser welding, brazing, diffusion bonding, fusing, adhering, or other similar methods. In some instances, the boss can form a metallurgical bond with the member along at least a portion of the interface between the boss and the member.

The boss can, according to one example, be joined to the member with the use of an adhesive or other material. For example, the boss and member can be joined by a glue or an adhesive, such as a resin or epoxy, by a heat activated film, by an injection molded plastic, and similar joining methods. In some examples, the boss and member can alternatively or additionally be joined together via mechanical engagement between the boss and member. For example, features of the boss can mechanically engage features of the member to mechanically join the boss and the member together. In some examples, these engagement features can range in size from nano- or micro-scaled features to macro-scale features having dimensions on the order or millimeters. The boss can include any desired shape or size, as described herein.

At block 1120, a feature or features are formed in the member while orienting the member via the boss. In some examples, a positioning apparatus can mechanically or otherwise engage the boss to support, orient, and position the member at block 1120. The positioning apparatus can position the member in any number of desired orientations via the boss or bosses. In some examples, the positioning apparatus can hold the member in one position or orientation while a feature is formed at block 1120. In other examples, however, a positioning apparatus can move the member between any number of different positions and orientations while the feature is formed at block 1120. The feature can include any desired shape or size, and can be any of the features described herein, such as those illustrated in FIGS. 5-8. In some examples, the feature can be formed by an additive manufacturing process, a subtractive manufacturing process, or combinations thereof. For example, the feature can be formed in the member by a subtractive process such as machining, etching, laser-based processes, cutting, grinding, and similar subtractive processes. Alternatively, the feature can be formed in or on the member by an additive process, such as a deposition process, a 3D printing process, and other similar additive processes. In some examples, multiple processes can be used to form the feature. Furthermore, multiple features can be formed in or on the member at block 1120.

At block 1130, the boss can be at least partially removed from the member to form the component or element, such as a frame component or element, as described herein. In some examples, substantially the entire boss can be removed from the member. In other embodiments, however, the boss can be formed into a feature itself and only the boss material required to form such a feature can be removed from the member. In some examples, the boss can be removed by any desired process, as described herein. For example, a boss or a portion of a boss can be removed from the member by processes such as machining, etching, laser-based processes, cutting, grinding, and other material removal processes.

In some examples, the formed element or component can be subjected to additional processing or treatment before, during, or after any of blocks 1110, 1120, or 1130. For example, an exterior surface of the element or component can be treated, for example, by depositing a PVD layer thereon, to provide a desired color or surface finish. The methods of FIG. 15 for forming an element or component for an electronic device are detailed below with reference to FIGS. 16-19

Figure 16:
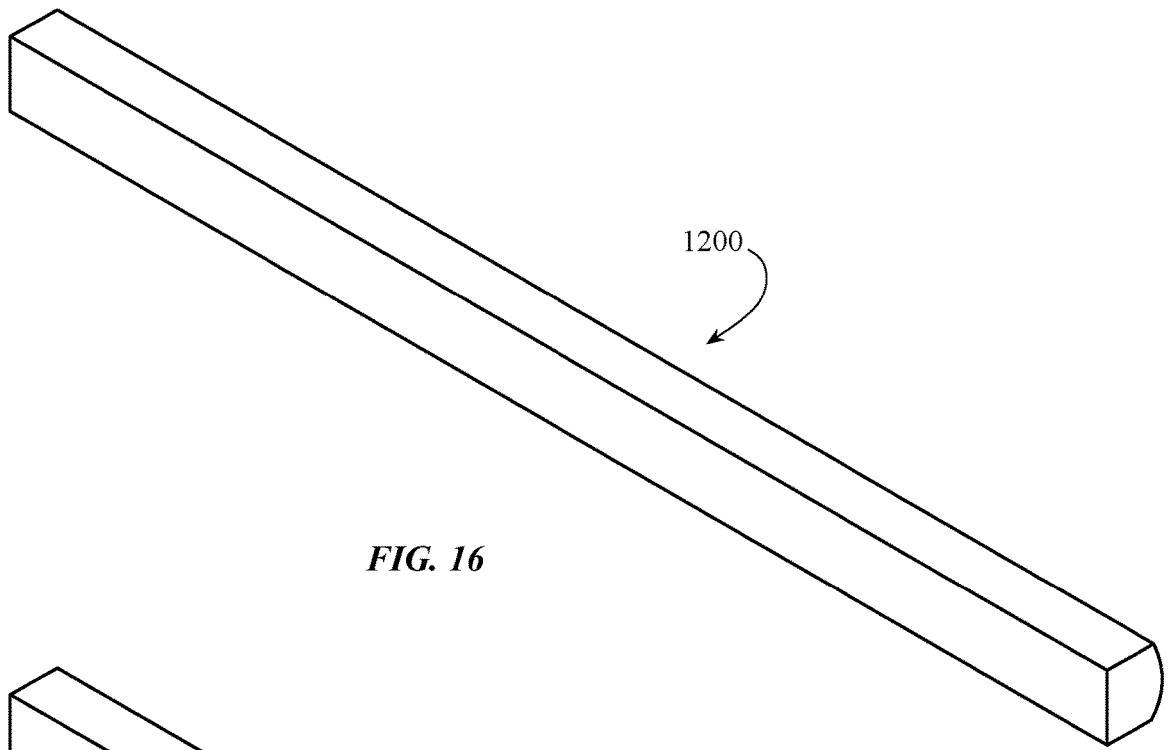
FIG. 16 shows a stage of a process for forming a component for an electronic device.

FIG. 16 illustrates a member 1200 that can be, for example, a frame member. As described herein, the member 1200 can be a composite body including one or more materials that can be subjected to processing or treatment prior to joining the one or more bosses. In some examples, the member can be a unitary piece of material, such as a polymer material, ceramic material, metal material, or combinations thereof. In some examples, however, the member can be a composite member including a pre-formed exterior portion joined to an interior portion, as described herein. Further, as can be seen, the member 1200 can include a substantially rounded or curved surface along at least one side.

Figure 17:
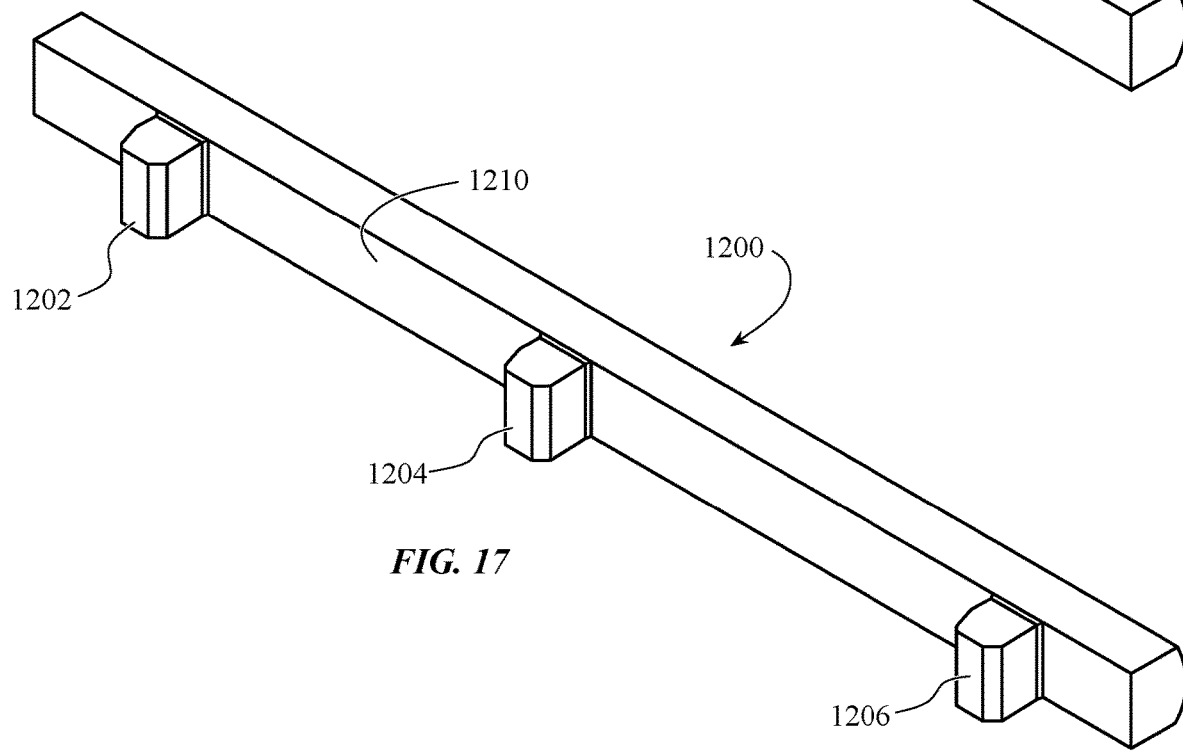
FIG. 17 shows a stage of a process for forming a component for an electronic device.

FIG. 17 shows the member 1200 including multiple bosses 1202, 1204, 1206 that have been joined to the member 1200, as described with respect to block 1110 of process 1100. As can be seen, the bosses 1202, 1204, 1206 can have a substantially rectangular prismatic shape with chamfers along one or more edges. In some examples, the bosses 1202, 1204, 1206 can be joined to a single surface of the member. In other examples, however, bosses 1202, 1204, 1206 can be joined to two or more different surfaces of the member 1200, as desired.

FIG. 18 illustrates the location of multiple features that can be formed in the member during a feature formation process, for example, as described above with respect to block 820 of process 800. As can be seen, the final formed element or component 1210 can be produced by removing material from the member 1200. For example, at least features 1222, 1224, and 1226, which can be similar to the features described herein with respect to FIGS. 5-8, can be formed in the member 1200. FIG. 19 shows the formed element or component 1210 after the bosses 1202, 1204, 1206 have at least partially been removed. In the present example, the bosses 1202 and 1206 have been substantially entirely removed from the member 1200. As can be seen, however, the boss 1204 has only been partially removed from the member 1200, with some material from the boss 1204 now forming feature 1228 of the element 1210. In this way, protruding features, such as feature 1228, can be formed on the member 1200 without the need to increase the dimensions of the member 1200 along its entire length, height or width.

While any number or variety of components of an electronic device, for example electronic device 100 or 200, can be formed from or can include a component, such as component 210, 310, 400, 510, 600, 710, 810, 1000, and/or 1110, the structure of these components can be, for example, a composite component including an exterior portion joined to an interior portion, as described herein. The structure and materials of the exterior and interior portion, as well as the composite component itself, can apply not only to the specific examples discussed herein, but to any number or variety of embodiments in any combination. Various embodiments of components, electronic devices, and methods of forming the same are described below with reference to FIGS. 20-24.

Figure 20:
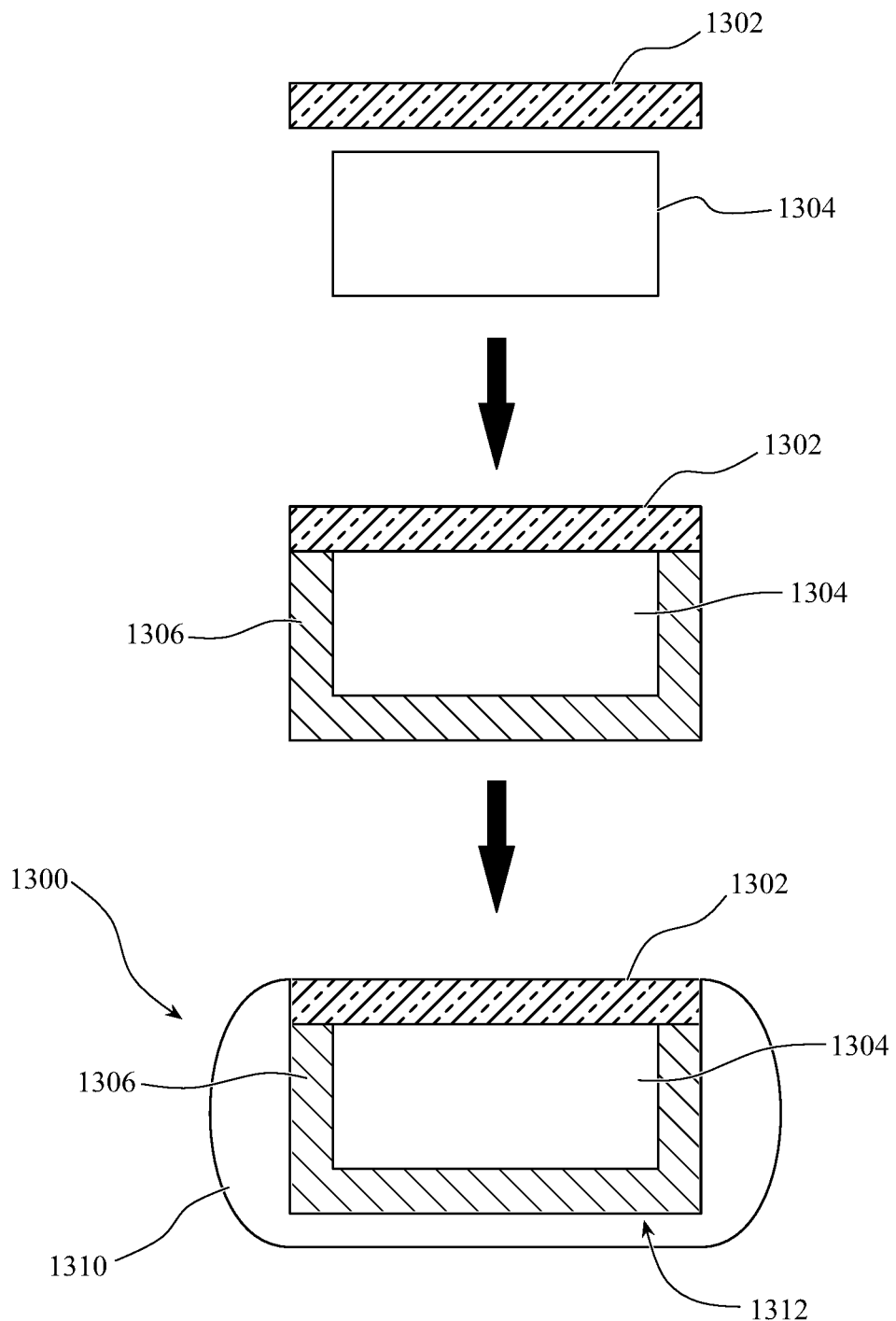
FIG. 20 shows a process flow diagram of stages of a method for forming an electronic device.

FIG. 20 illustrates a diagrammatic flow diagram including various stages of a method of forming an electronic device 1300. The process for forming the device 1300 can include at least partially surrounding a periphery of a display component 1304 with a moldable encapsulating material 1306, positioning a transparent cover 1302 adjacent to a major surface of the display component 1304, and joining the display component 1304 and transparent cover 1302 to the frame 1310 of the device 1300 by the moldable encapsulating material 1306.

In some examples, an encapsulating material 1306 can be provided to a display component 1304 in a moldable form to at least partially surround the display component 1304. In some examples, the encapsulating material 1306 can at least partially surround, one, two, three, or all of the sides of the display or display component 1304. The encapsulating material 1306 can be any desirable form of moldable material. For example, the encapsulating material 1306 can include a polymer material, such as an epoxy or resin. In other examples, the encapsulating material 1306 can be a composite material, such as a ceramic or glass reinforced polymer material. Alternatively, the moldable material 1306 can be a curable material, or can be heated to a moldable form, and then cooled to solidify.

The encapsulating material can serve to join or bond the display component to the frame, and thereby retain the display within the housing of the device. In some examples, the display component 1304 and encapsulating material 1306 can be bonded to one or more surfaces of the device 1300, such as support surface 1312. Further, in some examples, the encapsulating material 1306 can be disposed entirely within an internal volume of the device 1300. In some examples, the encapsulating material 1306 can be bonded or joined to the frame 1310 by an adhesive that can securely bond the encapsulating material and display component to the frame. In some examples, however, the moldable encapsulating material 1306 itself can directly bond to the frame 1310.

The device 1300 and concepts illustrated in FIG. 20 can be applied to any of the components and device described herein, in any combination. Further examples including the concepts and features discussed with respect to FIG. 20 are described below with reference to FIGS. 21-24.

Figure 21:
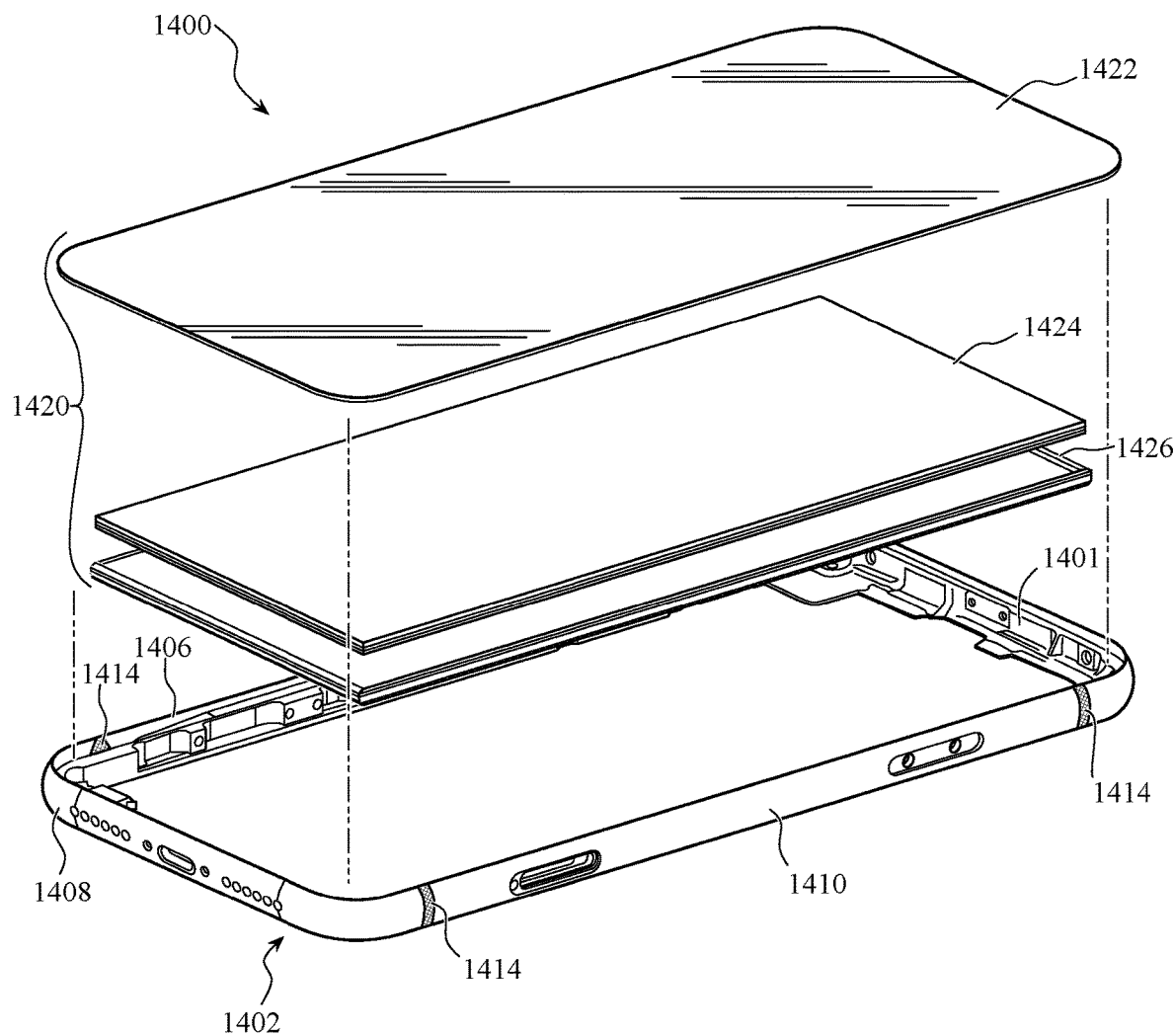
FIG. 21 shows an exploded view of an electronic device.

FIG. 21 shows an exploded view of an electronic device 1400 including various components. The electronic device 1400 can be substantially similar to electronic devices 100 and 200 described herein, with respect to FIGS. 1 and 2. The device 1400 can include a housing that has a band or a frame 1402, which can again be substantially similar to other bands described herein, for example with respect to FIGS. 1 and 2. In some examples, the band can include multiple components 1404, 1406, 1408, and 1410, such as composite components, that are joined by a moldable material 1414 to form the band 1402. The device can include a display 1420 that includes display components 1424, 1426, for example a backlight, filter, polarizer, LED array, liquid crystal array, electrodes, and other similar display components. The display 1420 can further include a transparent cover 1422 that can be formed of any desired transparent material, such as polymer, glass, or ceramic material such as sapphire. In some examples, the display can be an LCD display, an LED display, an OLED display, a plasma display, a quantum dot display, or any other type of display known in the art or developed in the future. The device 1400 can further include additional components, such as a chassis, a battery, processors, a back cover, and other components that are not shown.

Figure 22:
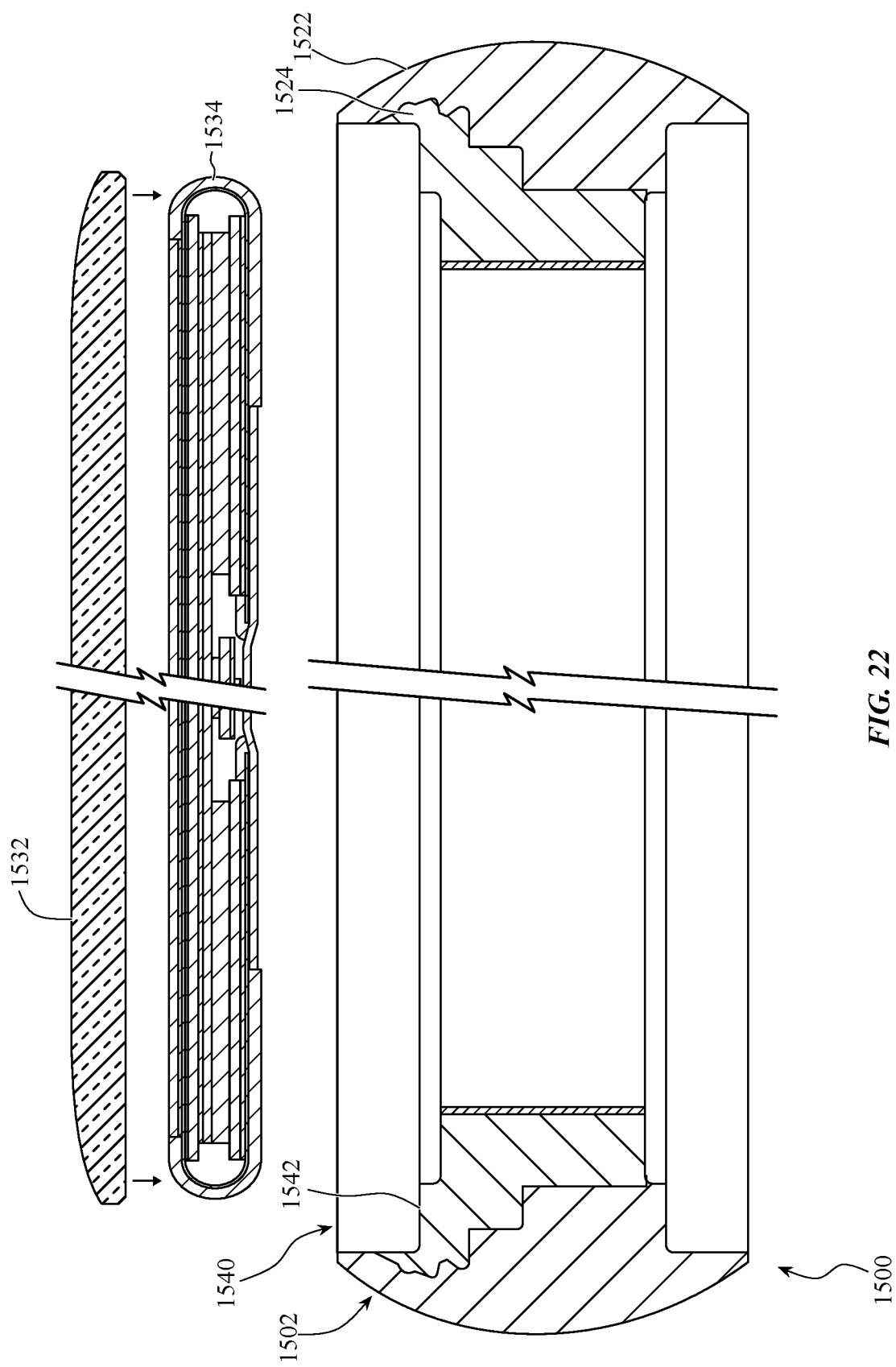
FIG. 22 shows an exploded cross-sectional view of an electronic device.

FIG. 22 shows an exploded cross-sectional view of an electronic device 1500 that can be substantially similar to electronic devices 100, 200, and 1000 described herein. The device 1500 includes a display component 1534 and a transparent cover 1532 overlying the display component and defining an exterior surface of the device 1500. The device 1500 can also include a housing that has a band 1502 that can be substantially similar to bands 102, 202, and 1002 described herein. In some examples, the band 1502 can include multiple composite components that can be joined together with a moldable material to form the band. In such examples, and as illustrated, the band 1502 can include one or more exterior portions 1522 including a first material and one or more interior portions 1524 including a second, independently selected material, as described herein. The band 1502 can at least partially define an exterior surface of the device 1500 and an internal volume of the device 1500.

In some examples, the band 1502 can include a cavity or a space 1540 sized to receive the display component 1534 and including a feature 1542 that is configured to receive the display and/or display component 1534. In some examples, the feature 1542 can be a recess, lip, protrusion, or other feature configured to receive and mechanically or structurally support the display component 1534.

Figure 23:
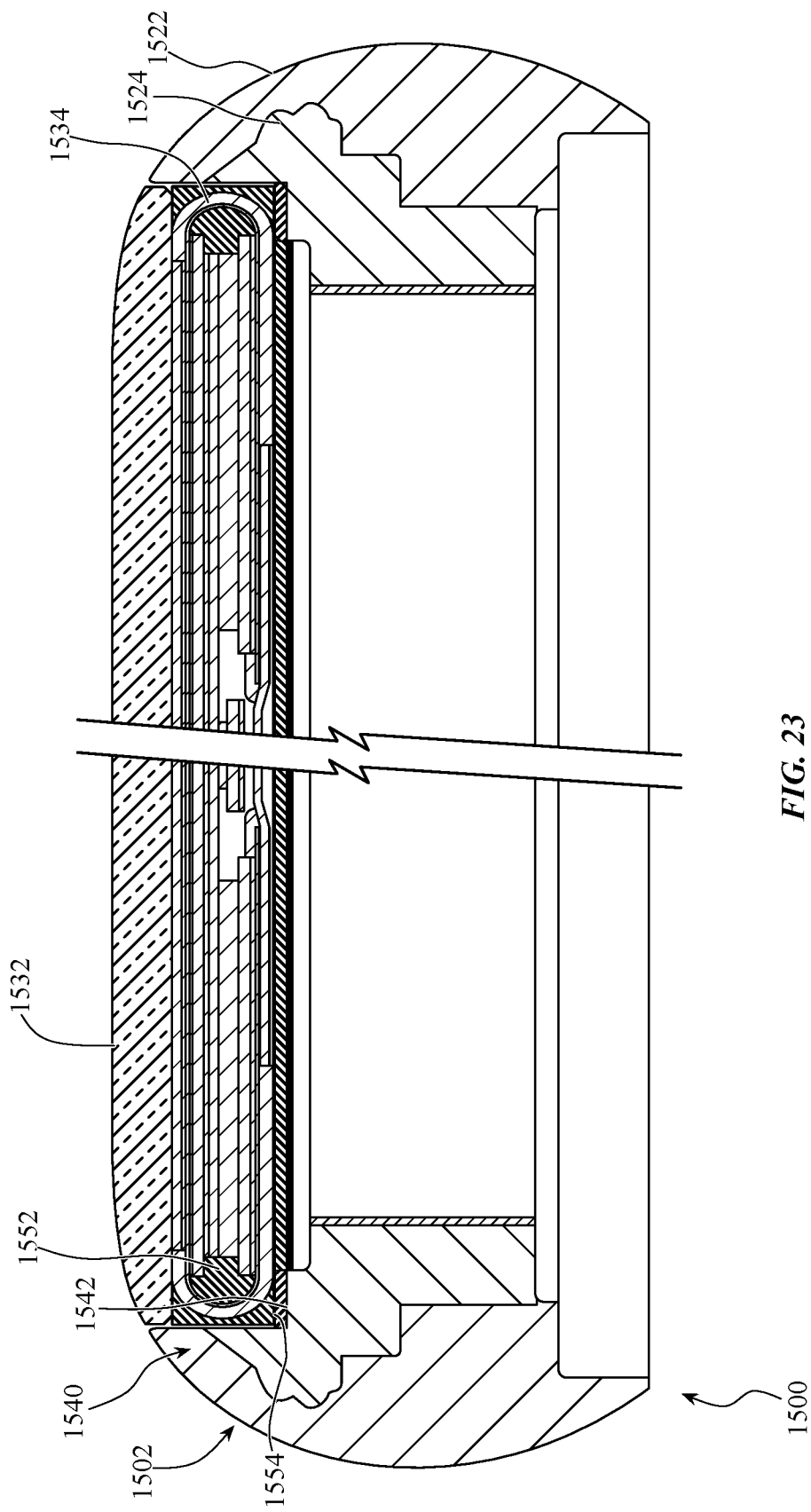
FIG. 23 shows a cross-sectional view of the electronic device of FIG. 21.

FIG. 23 illustrates an assembled device 1500, including an encapsulating material 1552 at least partially surrounding the periphery of the display component 1534, and joined or bonded directly to the band 1502. As described herein, the encapsulating material 1552 can be any desired moldable material and, in some examples, can be a polymer material such as epoxy or resin. As can be seen, in some examples, the encapsulating material 1552 can additionally surround a major surface of the display component 1534, for example the lower major surface. The encapsulating material 1552 can serve to join or bond the display component 1534 to the band 1502, and thereby retain the display within the housing of the device 1500. Further, in some examples, the encapsulating material 1552 can be disposed entirely within the internal volume of the device 1500. For example, where the band 1502 can include a curved surface that at least partially defines an exterior surface of the device 1500, the encapsulating material 1552 can be positioned interior to the curved surface. In some examples, and as illustrated, the encapsulating material 1552 can be bonded or joined to the band by an adhesive 1554 that can securely bond the encapsulating material 1552 and display component 1534 to the band 1502. In some examples, however, the material 1554 can be the encapsulating material 1552 itself.

As can be seen in FIG. 23, in some examples, an edge of the display component 1534 and the transparent cover 1532 can be substantially aligned with one another. Such a configuration can allow for the active area of the display, for example an area including pixels, to be positioned substantially closer to the edge of the transparent cover 1532 relative to configurations that utilize traditional display mounting components. Further, in some examples, the transparent cover 1532 can be disposed substantially adjacent to the band 1502. Such a configuration can create a more seamless visual transition between the band 1502 and the transparent cover 1532. Further, the active area of the display can be positioned closer to the band 1502 than might otherwise be achieved with traditional display mounting components.

Figure 24:
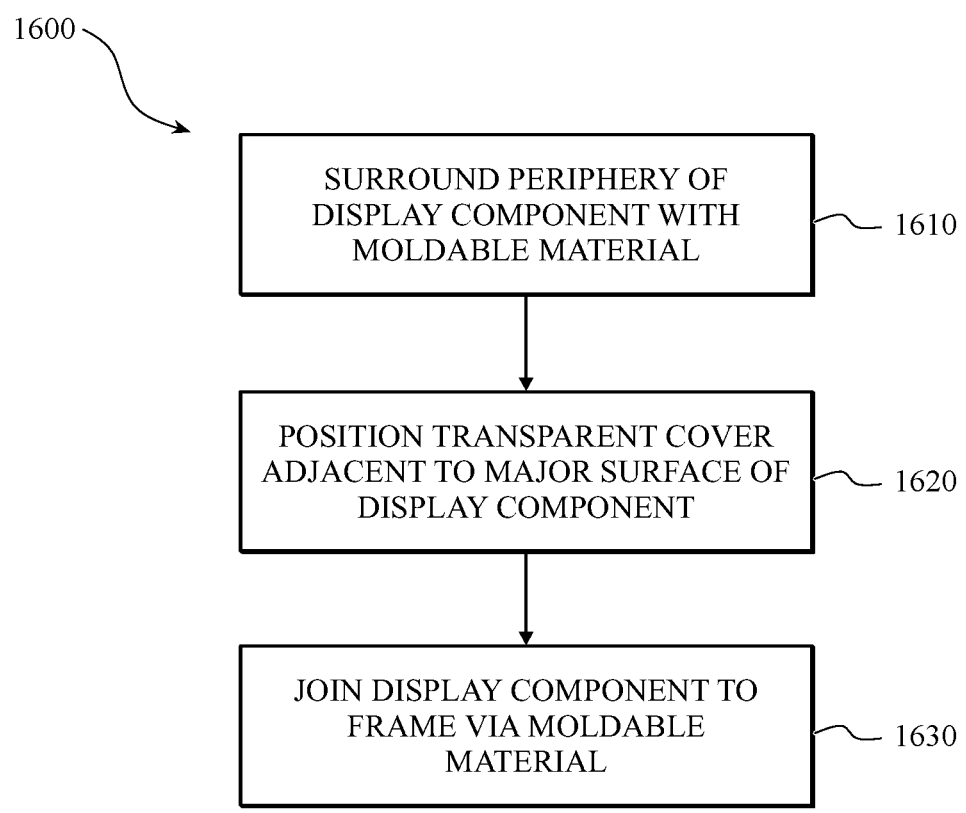
FIG. 24 shows a process flow diagram of a method for forming an electronic device.

FIG. 24 shows a process flow diagram of an exemplary process for forming an electronic device, as described herein. The process 1600 for forming the device can include at least partially surrounding a periphery of a display component with a moldable encapsulating material at block 1610, positioning a transparent cover adjacent to a major surface of the display component at block 1620, and joining the display component and transparent cover to the frame of the device by the moldable encapsulating material at block 1630.

At block 1610, an encapsulating material can be provided to a display component in a moldable form to at least partially surround the display component. For example, where a display or a display component can be substantially rectangular, the encapsulating material can at least partially surround, one, two, three, or all of the sides of the display or display component. In some examples, the encapsulating material can surround substantially the entire periphery of a display or display component. In some examples, the encapsulating material can at least partially surround a major surface of the display or display component. For example, the encapsulating material can at least partially surround the bottom major surface of a display component. The encapsulating material can be any desirable form of moldable material. For example, the encapsulating material can include a polymer material, such as an epoxy or resin. In other examples, the encapsulating material can be a composite material, for example a ceramic or glass reinforced polymer material. Alternatively, the moldable material can be a curable material, or can be heated to a moldable form, and then cooled to solidify.

At block 1620, a transparent cover can be positioned adjacent to a major surface of the display component. In some examples, the transparent cover can be positioned relative to the display component while the encapsulating material is still in moldable form. In other examples, however, the transparent cover can be positioned adjacent to the display component after the encapsulating material has hardened or solidified. Alternatively, the transparent cover can be positioned adjacent to the display component prior to surrounding the display component with the encapsulating material.

At block 1630, the display component can be joined or bonded to the frame of the electronic device via the moldable encapsulating material. The encapsulating material can serve to join or bond the display component to the frame, and thereby retain the display within the housing of the device. Further, in some examples, the encapsulating material can be disposed entirely within an internal volume of the device. In some examples, the encapsulating material can be bonded or joined to the frame by an adhesive that can securely bond the encapsulating material and display component to the frame. In some examples, however, the moldable encapsulating material itself can directly bond to the frame.

Any of the features or aspects of the components, devices, and methods discussed herein can be combined or included in any varied combination. For example, any methods of forming an element or component of a frame for an electronic device can be used in combination with any of the methods of forming engagement features on a component and forming an electronic device as described herein. The steps, stages, or blocks of any of the methods described herein can be performed in any desired order and can be performed simultaneously if desired. Further, a housing of a device can include a composite component as described herein that can include an engagement feature formed therein. Any method can be used to form such an engagement feature. Although certain methods and components are described with respect to housings, enclosures, or frames for electronic devices, the methods and components described herein can also be or form any number of additional components of an electronic device, including internal components, external components, cases, surfaces, or partial surfaces. As used herein, the terms exterior, outer, interior, and inner are used for reference purposes only. An exterior or outer portion of a composite component can form a portion of an exterior surface of the component, but may not necessarily form the entire exterior of outer surface thereof. Similarly, the interior or inner portion of a composite component can form or define an interior or inner portion of the component, but can also form or define a portion of an exterior or outer surface of the component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A method of forming an electronic device, comprising:
   at least partially surrounding a periphery of a display component with a moldable material, the moldable material extending across a thickness of the periphery;
   positioning a transparent cover adjacent to the display component; and
   joining the display component and the transparent cover to a frame element;
   the frame element at least partially defining an exterior surface of the electronic device.

2. The method of claim 1, wherein joining includes bonding the frame element to the moldable material with an adhesive.

3. The method of claim 2, wherein an edge of the transparent cover and an edge of the moldable material are substantially aligned in a plane and the plane is substantially parallel to and spaced apart from a wall of the frame element.

4. The method of claim 3, wherein the plane is perpendicular to a major surface of the transparent cover.

5. The method of claim 2, wherein the moldable material surrounds at least a portion of a bottom major surface of the display component.

6. The method of claim 2, wherein at least partially surrounding the periphery of the display component with the moldable material comprises introducing the display component to the moldable material in moldable form.

7. The method of claim 5, wherein the moldable material cures around the display component.

8. The method of claim 1, wherein the moldable material is positioned entirely within an internal volume of the electronic device at least partially defined by the frame element.

9. The method of claim 1, wherein the moldable material at least partially surrounds one, two, three, or all sides of the display component.

\* \* \* \* \*